(12) United States Patent
Hardiman et al.

(10) Patent No.: US 11,842,937 B2
(45) Date of Patent: Dec. 12, 2023

(54) ENCAPSULATION STACK FOR IMPROVED HUMIDITY PERFORMANCE AND RELATED FABRICATION METHODS

(71) Applicant: Cree, Inc., Durham, NC (US)

(72) Inventors: Chris Hardiman, Morrisville, NC (US); Daniel Namishia, Wake Forest, NC (US); Kyle Bothe, Cary, NC (US); Elizabeth Keenan, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 270 days.

(21) Appl. No.: 17/390,020

(22) Filed: Jul. 30, 2021

(65) Prior Publication Data

US 2023/0031205 A1    Feb. 2, 2023

(51) Int. Cl.
| | | |
|---|---|---|
| H01L 21/00 | (2006.01) |
| H01L 23/31 | (2006.01) |
| H01L 23/528 | (2006.01) |
| H01L 29/778 | (2006.01) |

(52) U.S. Cl.
CPC ...... *H01L 23/3171* (2013.01); *H01L 23/3192* (2013.01); *H01L 23/528* (2013.01); *H01L 29/7786* (2013.01)

(58) Field of Classification Search
CPC ............. H01L 23/3171; H01L 23/3192; H01L 23/528; H01L 29/7786
See application file for complete search history.

(56) References Cited

U.S. PATENT DOCUMENTS

| | | | | |
|---|---|---|---|---|
| 4,847,212 A | * | 7/1989 | Balzan | H01L 21/28587 438/185 |
| 4,849,376 A | * | 7/1989 | Balzan | H01L 29/475 438/720 |
| 4,946,547 A | | 8/1990 | Palmour et al. | |
| 4,965,218 A | * | 10/1990 | Geissberger | H01L 21/768 257/E29.05 |
| 5,192,987 A | | 3/1993 | Khan et al. | |
| 5,200,022 A | | 4/1993 | Kong et al. | |
| 5,210,051 A | | 5/1993 | Carter | |

(Continued)

FOREIGN PATENT DOCUMENTS

| | | | | |
|---|---|---|---|---|
| CN | 108604596 A | * | 9/2018 | ......... H01L 27/0629 |
| TW | 200620676 A | | 6/2006 | |

(Continued)

OTHER PUBLICATIONS

Billstrom et al. "High Performance GaN Front-end MMICs" 2011 6th European Microwave Integrated Circuit Conference (Oct. 2011).

(Continued)

*Primary Examiner* — Laura M Menz
(74) *Attorney, Agent, or Firm* — Myers Bigel, P.A.

(57) ABSTRACT

A transistor device includes a substrate, a semiconductor structure on the substrate, a metallization layer comprising a non-planar surface on a surface of the semiconductor structure, a non-planar encapsulation layer on the non-planar surface of the metallization layer, the non-planar encapsulation layer comprising a non-planar encapsulant surface that is opposite the non-planar surface, and a self-planarizing encapsulation layer on the non-planar encapsulation layer and comprising a planarized surface that is opposite the non-planar encapsulant surface.

25 Claims, 16 Drawing Sheets

(56) References Cited

U.S. PATENT DOCUMENTS

| | | | |
|---|---|---|---|
| 5,296,395 | A | 3/1994 | Khan et al. |
| RE34,861 | E | 2/1995 | Davis et al. |
| 5,393,993 | A | 2/1995 | Edmond et al. |
| 5,523,589 | A | 6/1996 | Edmond et al. |
| 6,246,076 | B1 | 6/2001 | Lipkin et al. |
| 6,316,793 | B1 | 11/2001 | Sheppard et al. |
| 6,548,333 | B2 | 4/2003 | Smith |
| 7,030,428 | B2 | 4/2006 | Saxler |
| 7,045,404 | B2 | 5/2006 | Sheppard et al. |
| 7,078,254 | B2 * | 7/2006 | Loh .............. H01L 33/647 438/26 |
| 7,259,402 | B2 | 8/2007 | Edmond et al. |
| 7,291,529 | B2 | 11/2007 | Slater et al. |
| 7,525,122 | B2 | 4/2009 | Ring et al. |
| 7,544,963 | B2 | 6/2009 | Saxler |
| 7,548,112 | B2 | 6/2009 | Sheppard |
| 7,592,211 | B2 | 9/2009 | Sheppard et al. |
| 7,615,774 | B2 | 11/2009 | Saxler |
| 7,709,269 | B2 | 5/2010 | Smith et al. |
| 7,932,111 | B2 | 4/2011 | Edmond |
| 8,049,252 | B2 | 11/2011 | Smith et al. |
| 8,120,064 | B2 | 2/2012 | Parikh et al. |
| 8,513,686 | B2 | 8/2013 | Edmond |
| 8,558,252 | B2 * | 10/2013 | Ibbetson ........... H01L 33/0095 257/91 |
| 8,563,372 | B2 | 10/2013 | Hagleitner et al. |
| 9,196,799 | B2 * | 11/2015 | Chitnis ............. H01L 33/505 |
| 9,214,352 | B2 | 12/2015 | Hagleitner et al. |
| 9,437,783 | B2 * | 9/2016 | Kar .................. H01L 33/40 |
| 9,607,876 | B2 * | 3/2017 | Lidow ............. H01L 21/8258 |
| 10,546,846 | B2 * | 1/2020 | Lowes ................ F21V 14/00 |
| 11,101,410 | B2 * | 8/2021 | Hussell ............. H01L 33/502 |
| 2011/0014755 | A1 | 1/2011 | Yang et al. |
| 2011/0129601 | A1 | 6/2011 | Moore et al. |
| 2015/0318383 | A1 | 11/2015 | Liu et al. |
| 2016/0133473 | A1 | 5/2016 | Wang et al. |
| 2020/0328146 | A1 * | 10/2020 | Kajiwara ........... H01L 23/535 |
| 2021/0313293 | A1 * | 10/2021 | Noori ............... H01L 24/20 |
| 2022/0084950 | A1 * | 3/2022 | Noori ............... H01L 23/047 |
| 2022/0376099 | A1 * | 11/2022 | Bothe .............. H01L 21/765 |
| 2023/0029763 | A1 * | 2/2023 | Hardiman ........ H01L 23/53295 |
| 2023/0031205 | A1 * | 2/2023 | Hardiman ........... H01L 29/7786 |
| 2023/0147981 | A1 * | 5/2023 | Pritchard ........... H01L 29/7606 257/27 |

FOREIGN PATENT DOCUMENTS

| | | | | |
|---|---|---|---|---|
| TW | 201036171 | A | 10/2010 | |
| TW | 201117370 | A | 5/2011 | |
| TW | 201133865 | A | 10/2011 | |
| TW | 201301521 | A | 1/2013 | |
| TW | 202013693 | A | 4/2020 | |
| WO | WO-2013169636 | A1 * | 11/2013 | ............ H01L 33/40 |
| WO | WO-2021202674 | A2 * | 10/2021 | ........... H01L 23/047 |
| WO | WO-2022055776 | A1 * | 3/2022 | ........ H01L 23/49811 |
| WO | WO-2023009405 | A1 * | 2/2023 | ......... H01L 23/3171 |

OTHER PUBLICATIONS

Chang et al. "High fmax × LG Product of AlGaN/GaN HEMTs on Silicon with Thick Rectangular Gate" IEEE Journal of the Electron Devices Society (May 2020).

Notification of Transmittal of the International Search Report and the Written Opinion of the International Searching Authority, or the Declaration, in corresponding PCT Application No. PCT/US2022/038121 (dated Nov. 18, 2022).

Taiwan Office Action Corresponding to Taiwanese Patent Application No. 111128551 (Foreign Text, 13 Pages, English Translation Thereof, 9 Pages) (dated Mar. 31, 2023).

Umeda et al. "Silicon Nitride Passivated Ultra Low Noise InAlAs/InGaAs HEMT's with n+-InGaAs/n+-InAlAs Cap Layer" IEICE Transactions on Electronics E75-C(6):649-655 (Jun. 25, 1992).

Yota et al. "Variable Frequency Microwave and Convection Furnace Curing of Polybenzoxazole Buffer Layer for GaAs HBT Technology" IEEE Transactions on Semiconductor Manufacturing 20(3):323-332 (Aug. 2007).

* cited by examiner

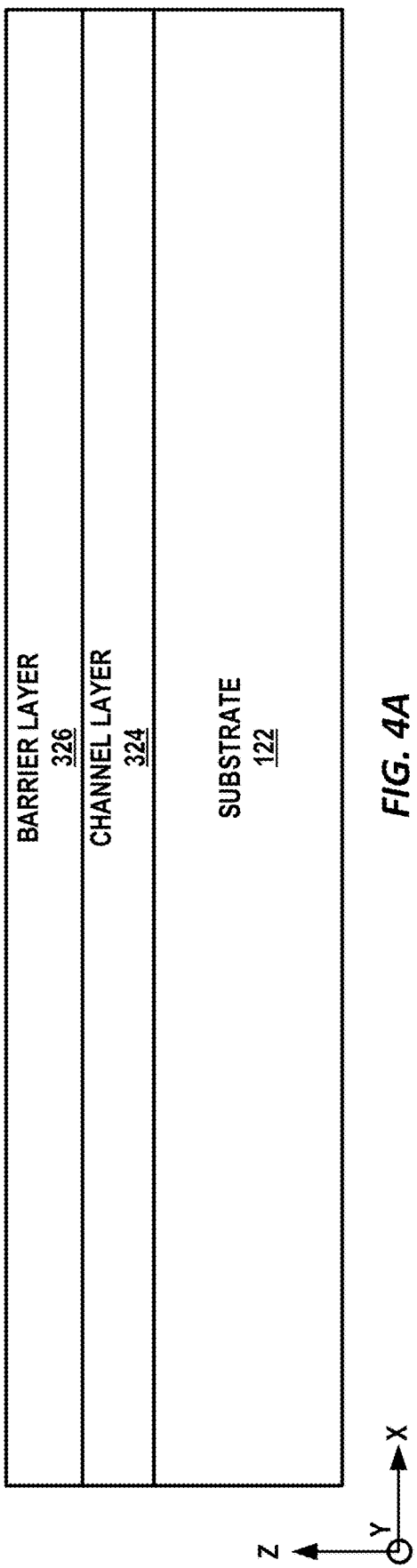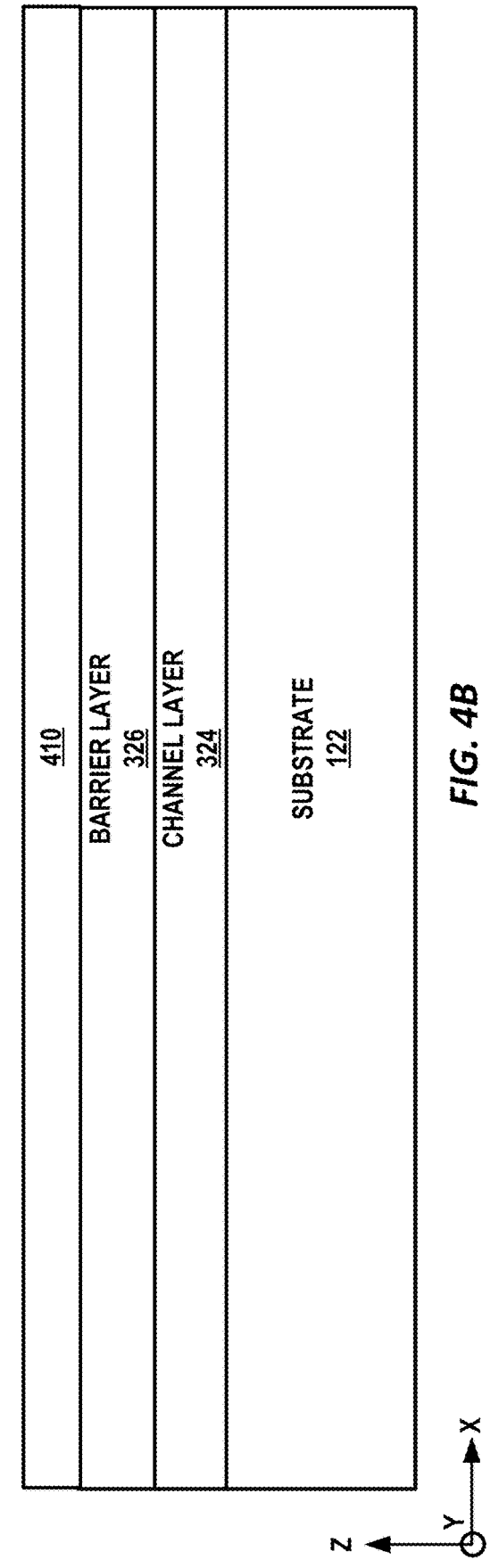

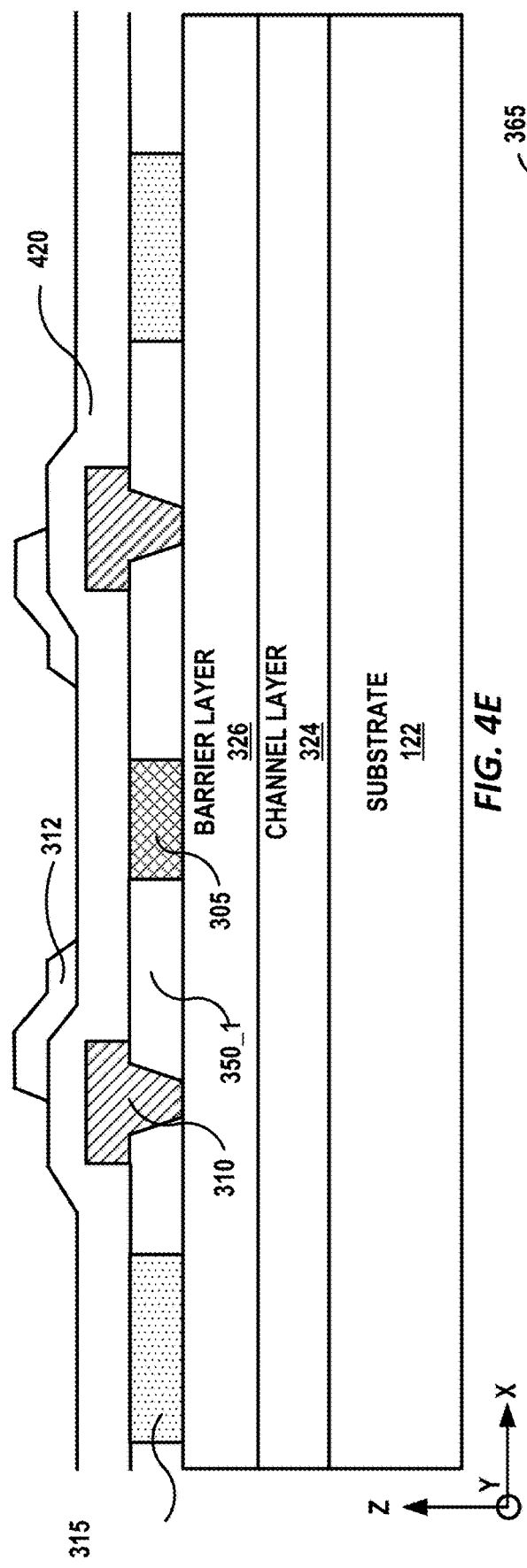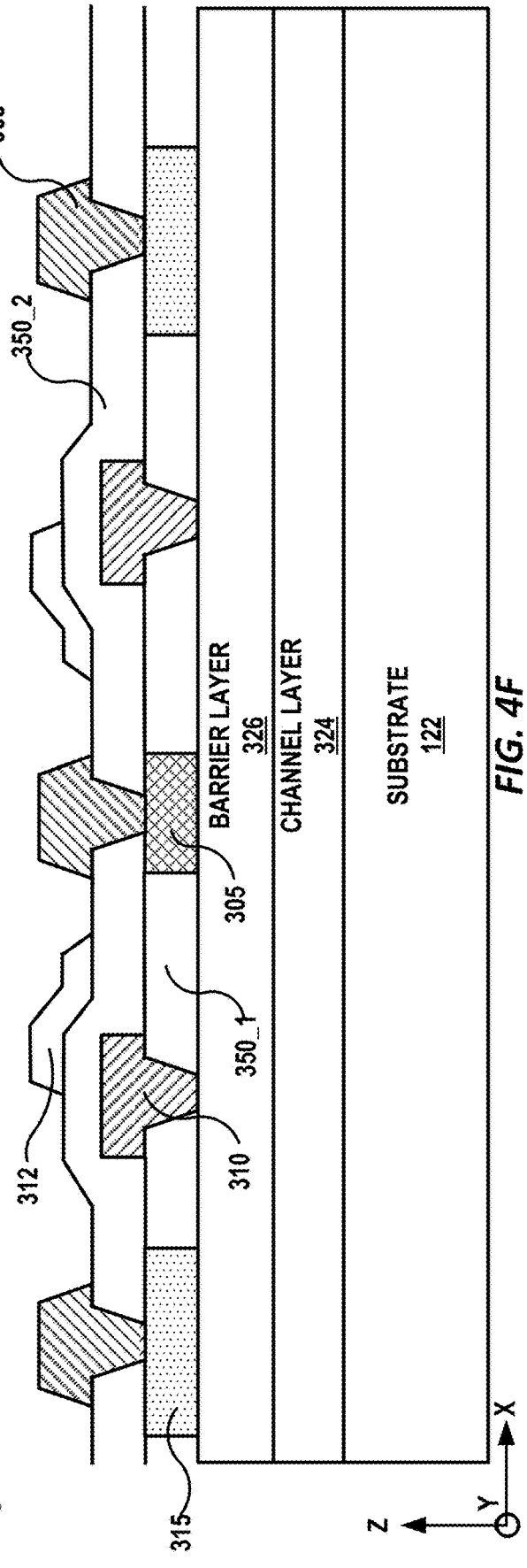

ENCAPSULATION STACK FOR IMPROVED HUMIDITY PERFORMANCE AND RELATED FABRICATION METHODS

FIELD

The present disclosure relates to semiconductor devices, and more particularly, to environmental protection of semiconductor devices and related fabrication methods.

BACKGROUND

Materials such as silicon (Si) and gallium arsenide (GaAs) have found wide application in semiconductor devices for low power and, in the case of Si, low frequency applications. However, these materials may not be well-suited for high power and/or high frequency applications, for example, due to their relatively small bandgaps (1.12 eV for Si and 1.42 for GaAs at room temperature) and relatively small breakdown voltages.

For high power, high temperature and/or high frequency applications and devices, wide bandgap semiconductor materials may be used, such as silicon carbide (SiC) (e.g., with a bandgap of about 3.2 eV for 4H-SiC at room temperature) and the Group III nitrides (e.g., with a bandgap of about 3.36 eV for gallium nitride (GaN) at room temperature). As used herein, the term "Group III nitride" refers to those semiconducting compounds formed between nitrogen (N) and the elements in Group III of the periodic table, usually aluminum (Al), gallium (Ga), and/or indium (In). The term refers to binary, ternary, and quaternary compounds, such as GaN, AlGaN, and AlInGaN. These compounds have empirical formulas in which one mole of nitrogen is combined with a total of one mole of the Group III elements. These materials may have higher electric field breakdown strengths and higher electron saturation velocities as compared to GaAs and Si.

Semiconductor devices fabricated from SiC and/or Group III nitrides may include power transistor devices, such as field effect transistor (FET) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc. These devices are typically passivated with an oxide layer, such as silicon dioxide ($SiO_2$), to, for example, protect the exposed surfaces of the device. The interface between the semiconductor body and the oxide layer, however, may be insufficient to obtain a high surface mobility of electrons. For example, the interface between SiC and $SiO_2$ conventionally exhibits a high density of interface states, which may reduce surface electron mobility and introduce carrier traps, which in turn can reduce the desired performance characteristics of devices.

Accordingly, semiconductor devices, including those that include oxide layers, may also incorporate one or more layers of silicon nitride (SiN) to improve the resulting electronic properties, e.g., as described in U.S. Pat. No. 6,246,076. SiN may also provide an environmental barrier, without which the structure and operation of the device may be susceptible to environmental degradation, regardless of the presence of an oxide layer. For example, semiconductor devices may operate in high temperature and/or high humidity environments. If moisture is allowed to reach the semiconductor devices, corrosion may occur, which may degrade performance of the semiconductor devices.

As an environmental barrier, SiN may form a better seal over the device in comparison to $SiO_2$, reducing or preventing contaminants such as water from reaching the epitaxial layers of the device and causing degradation. Plasma Enhanced Chemical Vapor Deposition (PECVD) may be used to form SiN as an environmental barrier for a semiconductor device, e.g., as described in U.S. Pat. No. 7,525,122. However, a PECVD SiN layer may be prone to defects, such as pin holes and columnar structures, which can allow moisture to penetrate the SiN layer and reach the device.

SUMMARY

According to some embodiments of the present disclosure, a transistor device includes a substrate; a semiconductor structure on the substrate; a metallization layer comprising a non-planar surface on a surface of the semiconductor structure; a non-planar encapsulation layer on the non-planar surface of the metallization layer, the non-planar encapsulation layer comprising a non-planar encapsulant surface that is opposite the non-planar surface; and a self-planarizing encapsulation layer on the non-planar encapsulation layer and comprising a planarized surface that is opposite the non-planar encapsulant surface.

In some embodiments, the transistor device further includes a source contact on a source region of the semiconductor structure; a drain contact on a drain region of the semiconductor structure; and a gate contact between the source contact and the drain contact. The non-planar encapsulation layer is on the gate contact, the drain contact, and the source contact.

In some embodiments, a ratio of a thickness of the non-planar encapsulation layer over the gate contact to a thickness of the self-planarizing encapsulation layer over the gate contact is between 0.20 and 0.29.

In some embodiments, the metallization layer comprises a transmission line on the source contact, and a ratio of a thickness of the non-planar encapsulation layer over the transmission line to a thickness of the self-planarizing encapsulation layer over the transmission line is between 0.28 and 0.45.

In some embodiments, the semiconductor structure further comprises a source access region between the source contact and the gate contact, and a ratio of a thickness of the non-planar encapsulation layer over the source access region to a thickness of the self-planarizing encapsulation layer over the source access region is between 0.16 and 0.22.

In some embodiments, a thickness of the non-planar encapsulation layer is substantially uniform over the semiconductor structure.

In some embodiments, the non-planar encapsulation layer comprises SiO, SiN, SiON, ZrO, HfO, AlN and/or AlO.

In some embodiments, wherein the self-planarizing encapsulation layer comprises polyimide, benzocyclobutene, glass, polyamide, polybenzoxazole, and/or a photoresist.

In some embodiments, the self-planarizing encapsulation layer comprises a material having an uncured kinematic viscosity of 100 to 8000 centistokes.

In some embodiments, the self-planarizing encapsulation layer comprises a material having a cure temperature of less than or equal to 250° C.

In some embodiments, the self-planarizing encapsulation layer comprises a material that is substantially cured.

According to some embodiments of the present disclosure, a transistor device includes a substrate; a semiconductor structure on the substrate, the semiconductor structure comprising an active region; a gate contact on the active region of the semiconductor structure; a first encapsulation layer extending on the gate contact; and a second encapsulation layer on the first encapsulation layer, the second encapsulation layer comprising a material having a cure temperature of less than or equal to 275° C.

In some embodiments, a ratio of a thickness of the first encapsulation layer over the gate contact to a thickness of the second encapsulation layer over the gate contact is between 0.20 and 0.29.

In some embodiments, the semiconductor structure further comprises a source region, the transistor device further comprises a source contact on the source region and a transmission line on the source contact, and the first encapsulation layer extending on the source contact and the transmission line.

In some embodiments, a ratio of a thickness of the first encapsulation layer over the transmission line to a thickness of the second encapsulation layer over the transmission line is between 0.28 and 0.45.

In some embodiments, the semiconductor structure further comprises a source access region between the source contact and the gate contact, and a ratio of a thickness of the first encapsulation layer over the source access region to a thickness of the second encapsulation layer over the source access region is between 0.16 and 0.22.

In some embodiments, a thickness of the first encapsulation layer is substantially uniform over the semiconductor structure.

In some embodiments, an upper surface of the second encapsulation layer is substantially planar over the semiconductor structure.

In some embodiments, the first encapsulation layer comprises SiO, SiN, SiON, ZrO, HfO, AlN and/or AlO.

In some embodiments, the second encapsulation layer comprises polyimide, benzocyclobutene, glass, polyamide, polybenzoxazole, and/or a photoresist.

In some embodiments, the second encapsulation layer comprises a material having a cure temperature of less than or equal to 250° C.

According to some embodiments of the present disclosure, a transistor device includes a semiconductor structure on a substrate, the semiconductor structure comprising a source region and a drain region; a source contact on the source region; a drain contact on the drain region; a first encapsulation layer conformally extending on the drain contact, on the source contact, and on the semiconductor structure between the drain contact and the source contact; and a second encapsulation layer on the first encapsulation layer, the second encapsulation layer comprising a material having a substantially planar upper surface that extends from the source contact to the drain contact. The material is configured to transition from a kinematic viscosity of 100 to 8000 centistokes to a cured state during a curing operation.

In some embodiments, the first encapsulation layer comprises SiO, SiN, SiON, ZrO, HfO, AlN and/or AlO.

In some embodiments, the first encapsulation layer comprises a plurality of layers.

In some embodiments, the second encapsulation layer comprises polyimide, benzocyclobutene, glass, polyamide, polybenzoxazole, and/or a photoresist.

In some embodiments, the second encapsulation layer comprises a material having a cure temperature of less than or equal to 275° C.

According to some embodiments of the present disclosure, a method of forming a transistor device includes forming a semiconductor structure on a substrate; forming a first encapsulant layer on the semiconductor structure comprising a non-planar surface opposite the semiconductor structure; forming a second encapsulant layer on the first encapsulant layer, wherein the second encapsulant layer comprises a planarized surface opposite the first encapsulant layer; and performing a curing process on the second encapsulation layer.

In some embodiments, the second encapsulant layer comprises a material that is configured to transition from a kinematic viscosity of 100 to 8000 centistokes to a cured state during the curing process.

In some embodiments, the planarized surface of the second encapsulant layer is a result of self-planarization of a material of the second encapsulant layer.

In some embodiments, the method further includes forming a source contact, a drain contact, and a gate contact on the semiconductor structure. Forming the first encapsulant layer includes forming the first encapsulant layer on the gate contact, the drain contact, and the source contact.

In some embodiments, wherein the second encapsulant layer has a non-planar surface that is opposite the planarized surface and extends on the first encapsulant layer along respective profiles defined by the source contact, the drain contact, and/or the gate contact.

In some embodiments, a thickness of the first encapsulant layer is substantially uniform on the gate contact, the drain contact, and the source contact.

In some embodiments, the second encapsulant layer comprises SiO, SiN, SiON, ZrO, HfO, AlN and/or AlO.

In some embodiments, the second encapsulant layer comprises polyimide, benzocyclobutene, glass, polyamide, polybenzoxazole, and/or a photoresist.

In some embodiments, the second encapsulant layer comprises a material having a cure temperature of less than or equal to 275° C.

In some embodiments, performing the curing process on the second encapsulant layer is performed at a temperature that is greater than a glass transition temperature of a material of the second encapsulant layer.

In some embodiments, performing the curing process on the second encapsulant layer is performed at a temperature less than or equal to 275° C.

In some embodiments, forming the second encapsulant layer on the first encapsulant layer is performed by operations comprising a spin-on process, a spray-on process, a vapor deposition process, an electroplating process, a blade-coating process and/or a slot-die deposition process.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 4A to 4K illustrate a method of fabricating a semiconductor device, according to embodiments of the present disclosure.

DETAILED DESCRIPTION

Figure 1:
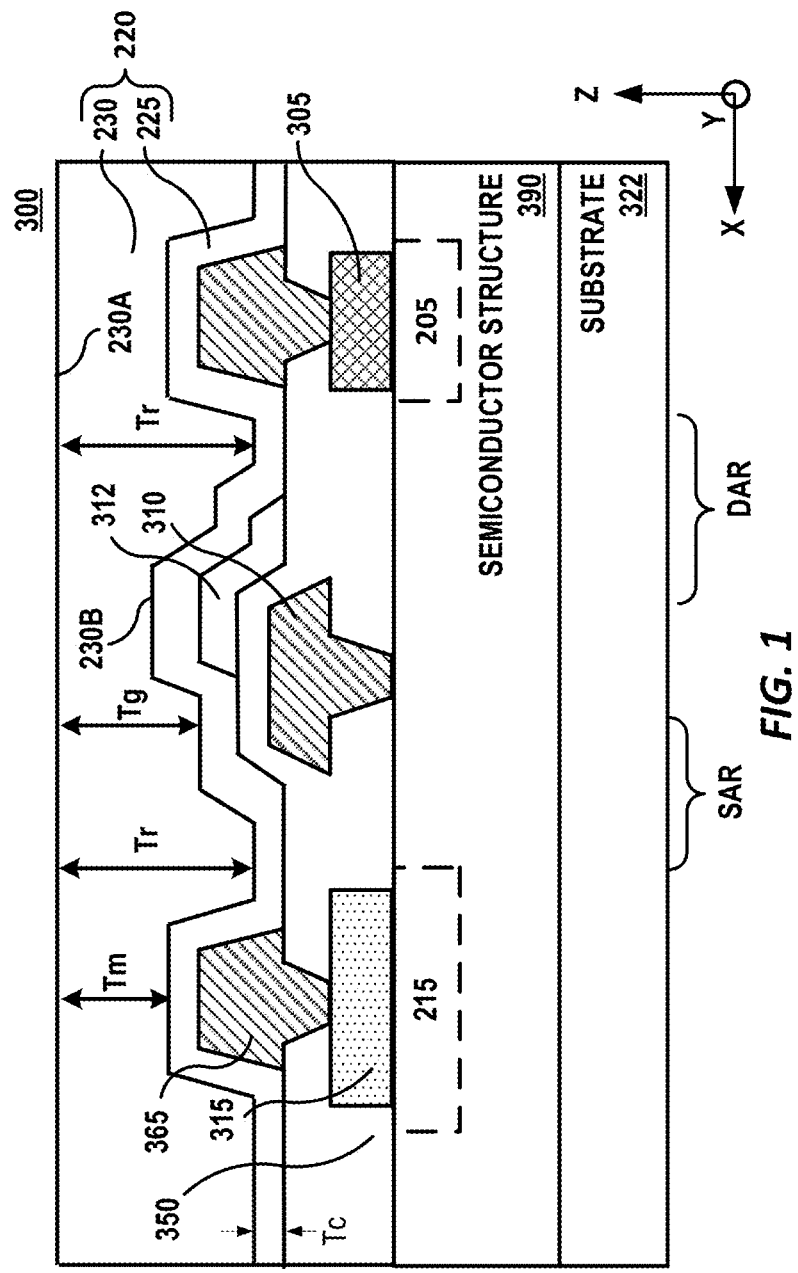
FIG. 1 is a schematic cross-sectional view of the semiconductor device or die according to some embodiments of the present disclosure.

Embodiments of the present inventive concepts are described more fully hereinafter with reference to the accompanying drawings, in which embodiments of the invention are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

While some semiconductor devices may be hermetically sealed within a package for environmental protection in some applications, in other applications the packages may not provide a hermetic seal against the operating environment. An encapsulation stack layer or structure may thus be provided on semiconductor devices at the die level, as protection from humidity and/or other conditions of the operating environment. As used herein, a die or chip may refer to a small block or body of semiconducting material or other substrate on which electronic circuit elements are fabricated. A die may include a large number of individual "unit cell" transistor structures, which in some implementations may be connected electrically in parallel or in series.

The encapsulation layer or structure may include a conformal dielectric film. The conformal dielectric film may typically be deposited using wafer-level processing methods such as chemical vapor deposition (CVD), plasma enhanced chemical vapor deposition (PECVD), atomic layer deposition (ALD), or physical vapor deposition (PVD). The conformal dielectric film can include one or more dielectrics or layers in a stacked fashion, including, for example, SiO, SiN, SiON, ZrO, HfO, AlN and/or AlO. Materials described herein with reference to compound chemical formulas (e.g., SiO, AlO) may include different stoichiometries or any compound of the constituent elements (e.g., $SiO_2$, $Al_2O_3$), and in some instances amorphous or crystalline states of the materials.

For example, some RF HEMT devices may include a SiN-based PECVD dielectric layer, which may serve as an environmental barrier protecting the underlying active area from external contamination, corrosion, and/or mechanical damage. However, as noted above, a PECVD SiN layer may be prone to defects, such as pin holes and columnar structures, which can allow moisture to reach the semiconductor device. To further improve robustness to environmental conditions and/or damage during die assembly of semiconductor devices (such as RF or DC transistor devices, including RF HEMTs), one or more additional layers may be included, providing a multi-layer encapsulation film or stack structure.

Some embodiments of the present invention may arise from a realization that the use of an encapsulation stack structure including both a conformal first encapsulation layer and a second encapsulation layer that is self-planarizing and/or cured may provide improved environmental protection. The use of the second encapsulation layer that is self-planarizing and/or cured may provide a substantially planar upper surface to the stack structure that is hardened due to the curing of the layer. As used herein, a substantially planar surface refers to a surface that varies/deviates by less than 10% from a theoretical plane (e.g., a planar surface). As used herein, self-planarization refers a process by which a material obtains a substantially planar upper surface without the need for additional mechanical and/or chemical steps to remove portions of the upper surface to achieve the planarity. The combination of the hardness of the upper surface of the stack structure as well as the planarity of the upper surface of the layer may provide improved protection from environmental conditions, such as humidity. The use of materials for the second encapsulation layer that have a cure temperature within the thermal budget of the semiconductor devices of the die (e.g., a maximum temperature after which the semiconductor devices may be damaged) may allow for the second encapsulation layer to fully and/or completely cure without damaging the semiconductor devices. As used herein, a cure temperature of a particular material refers to a temperature that induces a change in the hardness of the material such that material attains a hardness that is within 90% of the maximum hardness of the material that is possible. For example, when the material is or includes a polymer, the cure temperature of the material refers to a temperature that results in the polymer becoming crosslinked.

FIG. 1 is a schematic cross-sectional view of the semiconductor device or die 300 according to some embodiments of the present disclosure. FIG. 1 is intended to represent structures for identification and description and is not intended to represent the structures to physical scale.

As shown in FIG. 1, a multi-layer environmental encapsulation film or stack 220 is provided on a semiconductor structure 390 to cover the semiconductor structure 390 for protection from humidity and/or other conditions of the environment. The semiconductor structure 390 of FIG. 1 is a schematic example, shown as a generic semiconductor structure 390 upon which the multi-layer environmental encapsulation stack 220 is formed. The semiconductor structure 390 may be provided on a substrate 322, such as a silicon carbide (SiC) substrate or a sapphire substrate. The substrate 322 may be a semi-insulating SiC substrate. However, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 322 may be a SiC wafer, and the semiconductor device 300 may be formed, at least in part, via wafer-level processing, and the wafer may then be diced or otherwise singulated to provide a die including a plurality of the unit cell transistor structures. The term "semi-insulating" is used descriptively herein, rather than in an absolute sense.

The semiconductor structure 390 may be a SiC- and/or Group III nitride-based material in some embodiments. A portion of the semiconductor structure 390 may define a channel region of the semiconductor device 300. The channel region may extend between a source region 215 and a drain region 205 of the semiconductor device 300. Conduction in the channel region may be controlled by a signal applied to a gate contact 310. Signals may be applied to the source region 215 via source contact 315 and to drain region 205 via drain contact 305. Metal transmission lines 365 may be coupled to the source contact 315 and the drain contact 305 to provide the source and drain signals, respectively. A portion of the semiconductor structure 390 from below the source contact 315 to below the gate contact 310 may be referred to as the source access region SAR, and a portion of the semiconductor structure 390 from below the drain contact 305 to below the gate contact 310 may be referred to as the drain access region DAR In some embodiments, a one or more passivation layer(s) 350 may be provided on a surface of the semiconductor structure 390, and the multi-layer environmental stack 220 may be provided on the passivation layer(s) 350 opposite the semiconductor structure 390. The passivation layer(s) 350 may be configured to reduce parasitic capacitance, reduce charge trapping, and/or otherwise improve electronic properties of one or more layers of the semiconductor structure 390. The passivation layer(s) 350 may include one or more layers of SiN, for example, as deposited by CVD. More generally, the passivation layer(s) 350 may be a multi-layered deposition using a method other than an atomic layer deposition (ALD) method.

In some embodiments, a field plate 312 may be provided on the passivation layer(s) 350. In some embodiments, the field plate 312 may partially overlap the gate contact 310. The location and configuration of the field plate 312 is merely for example and not intended to limit the present specification. In some embodiments, additional field plates 312 may be present and/or the field plate 312 may be shaped differently and/or at different locations on the semiconductor device 300 than that illustrated in FIG. 1. In some embodiments the field plate 312 may not be present.

The multi-layer environmental encapsulation stack 220 may be formed on the field plate 312 (if present), the transmission lines 365, and/or the passivation layer(s) 350. The multi-layer environmental encapsulation stack 220 may include at least two layers: a first encapsulation layer 225 and a second encapsulation layer 230.

The first encapsulation layer 225 may be or include one or more dielectric layers that are conformally formed on the field plate 312 (if present), the transmission lines 365, and/or the passivation layer(s) 350. The field plate 312 (if present), the transmission lines 365, and/or the passivation layer(s) 350 may also be referred to herein as a metallization layer. A thickness Tc of the first encapsulation layer 225 may be substantially uniform across the semiconductor device 300, but the embodiments of the present disclosure are not limited thereto. As used herein, the thickness Tc is substantially uniform if it varies by less than 20% across the semiconductor device 300. In some embodiments, the thickness Tc may vary by less than 10% across the semiconductor device 300. The field plate 312 (if present), the transmission lines 365, and/or the passivation layer(s) 350 may have a non-planar surface and, as a result, the first encapsulation layer 225 may have a non-planar upper and lower surface as well due to its conformal shape.

The first encapsulation layer 225 may include, for example, SiO, SiN, SiON, ZrO, HfO, AlN and/or AlO. In some embodiments, the first encapsulation layer 225 may include multiple layers. For example, the first encapsulation layer 225 may include a SiON:SiN bilayer. The first encapsulation layer 225 may be deposited using wafer-level processing methods such as CVD, PECVD, ALD, or PVD.

The second encapsulation layer 230 may be formed on the first encapsulation layer 225 such that the first encapsulation layer 225 is between the second encapsulation layer 230 and the field plate 312 (if present), the transmission lines 365, and/or the passivation layer(s) 350. The second encapsulation layer 230 may be a curable dielectric layer formed in a viscous or liquid state, for example, by a spin-on process, a spray-on process, a vapor deposition process, an electroplating process, a blade-coating process, and/or a slot-die deposition process, which may initially fill-in surface irregularities (pin holes, columnar structures, etc.) or other non-planarity in the underlying first encapsulation layer 225. The second encapsulation layer 230 may include a material that allows the second encapsulation layer 230 to self-planarize. In other words, a viscosity of the material of the second encapsulation layer 230 may be such that the material settles with a substantially planar upper surface 230A. The second encapsulation layer 230 may further be fully cured to provide the substantially planar upper surface 230A opposite the first encapsulation layer 225. A lower surface 230B of the second encapsulation layer 230 may be on and/or contact the non-planar surface of the first encapsulation layer 225, and, as a result, the lower surface 230B of the second encapsulation layer 230 may be non-planar.

In some embodiments, the material of the second encapsulation layer 230 may be selected to have a cure temperature of less than or equal to 275° C. In some embodiments, the material of the second encapsulation layer 230 may be selected to have a cure temperature of less than or equal to 250° C. In some embodiments, the cure temperature of the second encapsulation layer 230 may allow the material of the second encapsulation layer 230 to be fully cured at a temperature that will not damage other elements of the semiconductor device 300.

In some embodiments, the material of the second encapsulation layer 230 may be selected to have a kinematic viscosity of 100 to 8000 centistokes (cSt). In some embodiments, the material of the second encapsulation layer 230 may be selected to have a kinematic viscosity of 1000 to 2000 cSt. In some embodiments, the viscosity of the second encapsulation layer 230 may allow the material of the second encapsulation layer 230 to fill surface irregularities (e.g., pin holes, columnar structures, etc.) or other non-planarity in the underlying first encapsulation layer 225. In some embodiments, the viscosity of the second encapsulation layer 230 may allow the upper surface 230A of the second encapsulation layer 230 to self-planarize and to flow to cover the non-planar surface of the first encapsulation layer 225 (including any surface imperfections and cavities thereof). The self-planarization of the second encapsulation layer 230 may allow for the formation of a planar upper surface 230A without the need for polishing or other chemical and/or mechanical steps to achieve a planar upper surface.

The second encapsulation layer 230 may include, for example, polyimide, benzocyclobutene (BCB), glass (e.g., borosilicate glass (BSG)), polyamide, polybenzoxazole (PBO), and/or a photoresist (e.g., SU-8). Other epoxies and/or resins may be used without deviating from the embodiments of the present disclosure.

The upper surface 230A of the second encapsulation layer 230 may be substantially planar across the width of the semiconductor device 300 despite differences in the various heights of the underlying structures of the semiconductor device 300. For example, in some embodiments, a level of the upper surface 230A may not vary by more than 10% across the width of the semiconductor device 300. In some embodiments, a level of the upper surface 230A may not vary by more than 5% across the width of the semiconductor device 300. The second encapsulation layer 230 may have a conformal and/or non-planar lower surface 230B that is opposite the substantially planar upper surface 230A. The conformal and/or non-planar lower surface 230B of the second encapsulation layer 230 may extend on the first encapsulation layer 225 along respective profiles defined by the source contact 315, the drain contact 305, the gate contact 310, the metal transmission lines 365, and/or the field plate 312 (e.g., the metallization layer).

In some embodiments, a thickness of the second encapsulation layer 230 may vary across the semiconductor device 300. The second encapsulation layer 230 may have a thickness Tm over the transmission line 365, a thickness Tr over the source access region SAR and/or the drain access region DAR, and a thickness Tg over the gate contact 310. The thickness Tm may refer to a thickness of the second encapsulation layer 230 between the upper surface 230A of the second encapsulation layer 230 and an upper surface of the first encapsulation layer 225 on an uppermost portion of the transmission line 365. The thickness Tg may refer to a thickness of the second encapsulation layer 230 between the upper surface 230A of the second encapsulation layer 230 and an upper surface of the first encapsulation layer 225 on an uppermost portion of the gate contact 310. The thickness Tr may refer to a thickness of the second encapsulation layer 230 between the upper surface 230A of the second encapsulation layer 230 and an upper surface of the first encapsulation layer 225 on an uppermost portion of the semiconductor structure 390 in the source access region SAR or the drain access region DAR.

In some embodiments, the second encapsulation layer 230 may be formed to maintain a ratio of the various thicknesses Tr, Tm, and Tg of the second encapsulation layer 230 to the thickness Tc of the first encapsulation layer 225. In some embodiments, the ratios of the thicknesses Tr, Tm, and Tg of the second encapsulation layer 230 to the thickness Tc of the first encapsulation layer 225 may be maintained according to Table 1.

TABLE 1

| Location | Tc Thickness Range (μm) | Second Encapsulation layer 230 Thickness Range (μm) | Ratio Range of First layer: Second layer |
|---|---|---|---|
| Over transmission line (Tm) | 1.15-1.4 | 3.1-4.1 | 0.28-0.45 |
| Over Gate (Tg) | 1.15-1.4 | 4.7-5.6 | 0.20-0.29 |
| Over Drain/Source access region (Tr) | 1.15-1.4 | 6.2-7.2 | 0.16-0.22 |

The device having the ratios according to Table 1 allows for sufficient protection over various areas of the device. The varying of the ratios results, in part, from the planar upper surface of the second encapsulation layer 230 and the varying surface of the first encapsulation layer 225. As a result, though a bottom surface of the second encapsulation layer 230 varies as a result of the varying upper surface of the first encapsulation layer 225, the upper surface 230A of the second encapsulation layer 230 remains substantially planar. Devices having ratios outside of these ranges may have reduced performance and/or humidity protection.

FIG. 1 provides an illustration of the multi-layer environmental encapsulation stack 220 on a semiconductor device 300 having a number of structures such as a gate contact 310, a source contact 315, and a drain contact 305. As would be understood by one of ordinary skill in the art, the multi-layer environmental encapsulation stack 220 may be applied to a number of different semiconductor structures without deviating from the embodiments of the present disclosure.

Figure 2A:
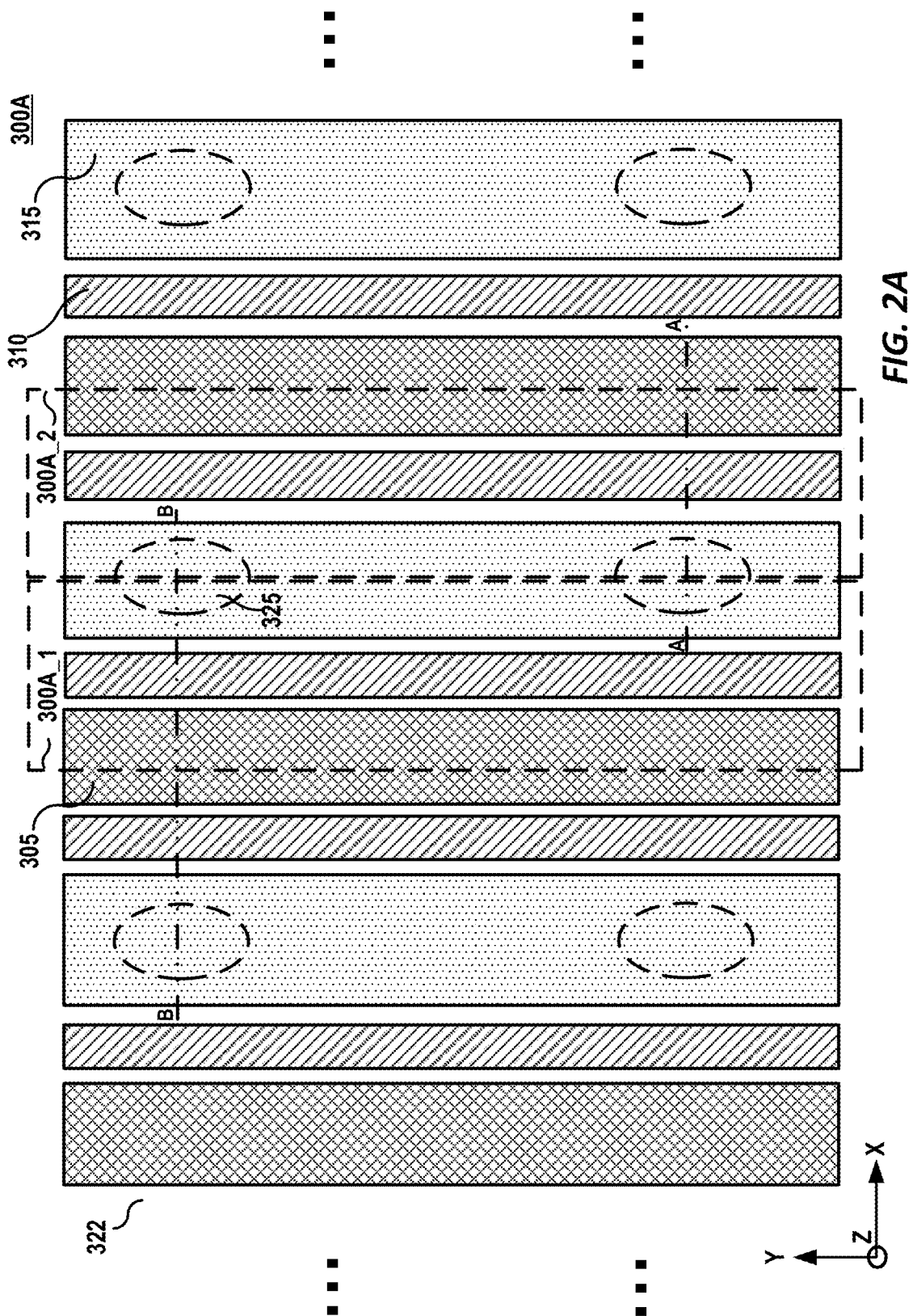
FIG. 2A is a schematic plan view of a HEMT device according to embodiments of the present disclosure.
Figure 2B:
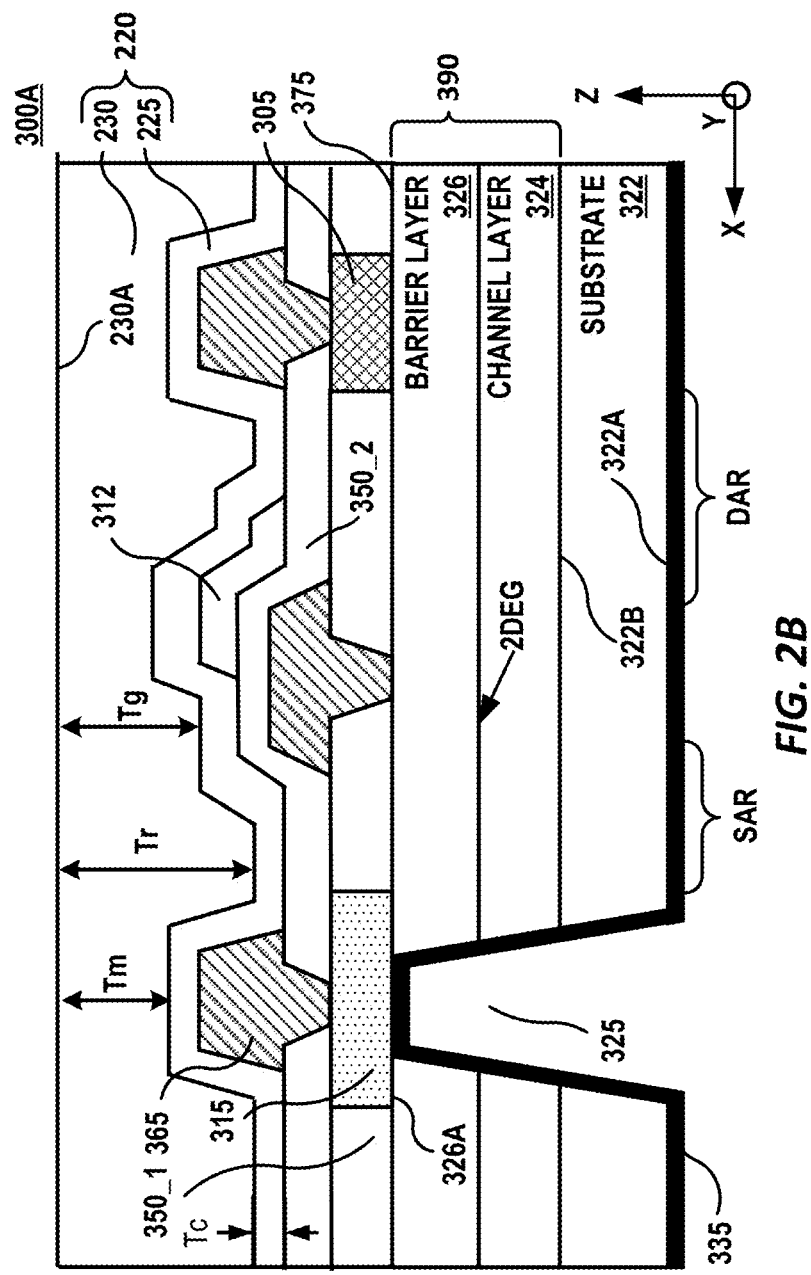
FIG. 2B is a schematic cross-sectional view of the HEMT device taken along line A-A of FIG. 2A.

For example, FIGS. 2A and 2B illustrate an embodiment of a semiconductor device 300A implemented as a HEMT, according to some embodiments of the present disclosure. FIG. 2A is a schematic plan view of the HEMT device 300A according to embodiments of the present disclosure. FIG. 2B is a schematic cross-sectional view of the HEMT device 300A taken along line A-A of FIG. 2A. FIGS. 2A and 2B are intended to represent structures for identification and description and are not intended to represent the structures to physical scale.

Referring to FIGS. 2A and 2B, a semiconductor structure 390, such as a semiconductor structure for a Group III nitride semiconductor HEMT, may be formed on a substrate 322 such as a silicon carbide SiC substrate or a sapphire substrate. The substrate 322 may be a semi-insulating silicon carbide (SiC) substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc.

In some embodiments, the silicon carbide bulk crystal of the substrate 322 may have a resistivity equal to or higher than about $1 \times 10^5$ ohm-cm at room temperature. Example SiC substrates that may be used in some embodiments of the present disclosure are manufactured by, for example, Cree, Inc., of Durham, N.C., the assignee of the present disclosure, and methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although silicon carbide may be used as a substrate material, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 322 may be a silicon carbide wafer, and the HEMT device 300A may be formed, at least in part, via wafer-level processing, and the wafer may then be diced to provide a plurality of individual high electron mobility transistors 300A.

The substrate 322 may have a lower surface 322A and an upper surface 322B. In some embodiments, the substrate 322 of the HEMT device 300A may be a thinned substrate 322. In some embodiments, the thickness of the substrate 322 (e.g., in a vertical Z direction in FIG. 2B) may be 100 μm or less. In some embodiments, the thickness of the substrate 322 may be 75 μm or less. In some embodiments, the thickness of the substrate 322 may be 50 μm or less.

A channel layer 324 is formed on the upper surface 322B of the substrate 322 (or on the optional layers described further herein), and a barrier layer 326 is formed on an upper surface of the channel layer 324. The channel layer 324 and the barrier layer 326 may each be formed by epitaxial growth in some embodiments. Techniques for epitaxial growth of Group III nitrides have been described in, for example, U.S. Pat. Nos. 5,210,051, 5,393,993, and 5,523,589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials. In some embodiments, a thickness of the wafer (e.g., the thickness of the substrate 322, the channel layer 324, and the barrier layer 326) may be between 40 μm to about 100 μm. In some embodiments, the wafer thickness may be between 40 μm to about 80 μm. In some embodiments, the wafer thickness may be approximately 75 μm.

In some embodiments, the channel layer 324 may be a Group III nitride, such as $Al_xGa_{1-x}N$, where $0 \le x<1$, provided that the energy of the conduction band edge of the channel layer 324 is less than the energy of the conduction band edge of the barrier layer 326 at the interface between the channel and barrier layers 324, 326. In certain embodiments of the present disclosure, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 μm. The channel layer 324 may also be a multi-layer structure, such as a superlattice or combinations of GaN, AlGaN or the like. The channel layer 324 may be under compressive strain in some embodiments.

In some embodiments, the barrier layer 326 is AlN, AlInN, AlGaN or AlInGaN or combinations of layers thereof. The barrier layer 326 may comprise a single layer or may be a multi-layer structure. In some embodiments, the barrier layer 326 may be a thin AlN layer directly on the channel layer 324 and a single AlGaN or multiple layers thereon. In particular embodiments of the present disclosure, the barrier layer 326 may be thick enough and may have a high enough aluminum (Al) composition and doping to induce a significant carrier concentration at the interface between the channel layer 324 and the barrier layer 326 through polarization effects when the barrier layer 326 is buried under ohmic contact metal. The barrier layer 326 may, for example, be from about 0.1 nm to about 30 nm thick, but is not so thick as to cause cracking or substantial defect formation therein. In some embodiments, the thickness of the barrier layer is between 13 and 18 nm. In certain embodiments, the barrier layer 326 is undoped or doped with an n-type dopant to a concentration less than about $10^{19}$ cm$^{-3}$. In some embodiments, the barrier layer 326 is $Al_xGa_{1-x}N$ where $0<x<1$. In particular embodiments, the aluminum concentration is about 25%. However, in other embodiments of the present disclosure, the barrier layer 326 comprises AlGaN with an aluminum concentration of between about 5% and less than about 100%. In specific embodiments of the present disclosure, the aluminum concentration is greater than about 10%. The channel layer 324 and/or the barrier layer 326 may be deposited, for example, by metal-organic chemical vapor deposition (MOCVD), molecular beam epitaxy (MBE), or hydride vapor phase epitaxy (HYPE). As discussed herein, a 2 DEG layer is induced in the channel layer 324 at a junction between the channel layer 324 and the barrier layer 326. The 2 DEG layer acts as a highly conductive layer that allows conduction between the source and drain regions of the device that are beneath the source contact 315 and the drain contact 305, respectively. The channel layer 324 and the barrier layer 326 form the semiconductor structure 390.

While the semiconductor structure 390 is shown with channel layer 324 and barrier layer 326 for purposes of illustration, the semiconductor structure 390 may include additional layers/structures/elements such as a buffer and/or nucleation layer(s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an MN buffer layer may be formed on the upper surface 322B of the substrate 322 to provide an appropriate crystal structure transition between the silicon carbide substrate 322 and the remainder of the HEMT device 300A. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HYPE.

The source contact 315 and the drain contact 305 may be formed on an upper surface 326A of the barrier layer 326 and may be laterally spaced apart from each other. A gate contact 310 may be formed on the upper surface 326A of the barrier layer 326 between the source contact 315 and the drain contact 305. The material of the gate contact 310 may be chosen based on the composition of the barrier layer 326, and may, in some embodiments, be a Schottky contact. Conventional materials capable of making a Schottky contact to a gallium nitride-based semiconductor material may be used, such as, for example, nickel (Ni), platinum (Pt), nickel silicide (NiSi$_x$), copper (Cu), palladium (Pd), chromium (Cr), tungsten (W) and/or tungsten silicon nitride (WSiN).

The source contact 315 and the drain contact 305 may include a metal that can form an ohmic contact to a gallium nitride-based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSi$_x$, titanium silicide (TiSi), titanium nitride (TiN), WSiN, Pt and the like. In some embodiments, the source contact 315 may be an ohmic source contact 315. Thus, the source contact 315 and the drain contact 305 may contain an ohmic contact portion in direct contact with the barrier layer 326. In some embodiments, the source contact 315 and/or the drain contact 305 may be formed of a plurality of layers to form an ohmic contact that may be provided as described, for example, in commonly assigned U.S. Pat. Nos. 8,563,372 and 9,214,352, the disclosures of which are hereby incorporated herein in their entirety by reference.

The source contact 315 may be coupled to a reference signal such as, for example, a ground voltage. The coupling to the reference signal may be provided by a via 325 that extends from the lower surface 322A of the substrate 322, through the substrate 322 to the upper surface 326A of the barrier layer. The via 325 may expose a bottom surface of the source contact 315. A backmetal layer 335 may be formed on the lower surface 322A of the substrate 322 and on side walls of the via 325. In some embodiments, the backmetal layer 335 may directly contact the source contact 315. In some embodiments, the backmetal layer 335 may be indirectly electrically connected to the source contact 315 via additional conductive paths. Thus, the backmetal layer 335, and a signal coupled thereto, may be electrically connected to the source contact 315.

In some embodiments, the source contact 315, the drain contact 305, and the gate contact 310 may be formed as a plurality of source contacts 315, drain contacts 305, and gate contacts 310 on the substrate 322. Referring to FIG. 2A, a plurality of drain contacts 305 and source contacts 315 may be alternately arranged on the substrate 322. A gate contact 310 may be disposed between adjacent drain contacts 305 and source contacts 315 to form a plurality of transistor unit cells, examples of which are designated as 300A_1 and 300A_2 in FIG. 2A. Respective ones of the transistor unit cells 300A_1, 300A_2 may include a source contact 315, a drain contact 305, and a gate contact 310. FIGS. 2A and 2B illustrate a subset of the source contacts 315, drain contacts 305, and gate contacts 310 for ease of discussion, but it will be understood that the HEMT device 300A may have additional structures, including additional source contacts 315, drain contacts 305, and gate contacts 310, that are not illustrated in FIGS. 2A and 2B. As will be understood by one of ordinary skill in the art, a HEMT transistor may be formed by the active region between the source contact 315 and the drain contact 305 under the control of a gate contact 310 between the source contact 315 and the drain contact 305.

Referring to FIG. 2B, a first insulating layer 350_1 may be formed on the barrier layer 326 and a second insulating layer 350_2 may be formed on the first insulating layer 350_1. In some embodiments, the first insulating layer 350_1 and/or the second insulating layer 350_2 may include silicon nitride ($Si_xN_y$), aluminum nitride (AlN), silicon dioxide ($SiO_2$), and/or other suitable protective material. The thickness of the first insulating layer 350_1 may affect the gate-to-source capacitance and the gate-to-drain capacitance, which can impact the switching speed of the device 300A. Similarly, the thickness of the second insulating layer 350_2 may affect gate-to-drain capacitance, which can impact the switching speed and gain of the device 300A. The first and second insulating layers 350_1, 350_2 may form the passivation layer(s) 350 referred to in FIG. 1.

The source contact 315 and the drain contact 305 may be formed in the first insulating layer 350_1, portions of each of which may be under the second insulating layer 350_2. It will be understood that the present invention is not limited to a particular shape of the gate contact 310 illustrated in FIG. 2B, and that other shapes of the gate contact 310, as well as the other elements of the device 300A, are possible without deviating from the embodiments described herein. In some embodiments, the gate contact 310 may be closer to the source contact 315 than the drain contact 305. In some embodiments, the gate contact 310 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 350_2 may be formed on the first insulating layer 350_1 and on portions of the drain contact 305, gate contact 310, and source contact 315.

Field plates 312 may be formed on the second insulating layer 350_2. At least a portion of a field plate 312 may be on the gate contact 310. At least a portion of the field plate 312 may be on a portion of the second insulating layer 350_2 that is between the gate contact 310 and the drain contact 305. The field plate 312 can reduce the peak electric field in the HEMT device 300A, which can result in increased breakdown voltage and reduced charge trapping. The reduction of the electric field can also yield other benefits such as reduced leakage currents and enhanced reliability. Field plates and techniques for forming field plates are discussed, by way of example, in U.S. Pat. No. 8,120,064, the disclosure of which is hereby incorporated herein in its entirety by reference.

Transmission lines 365 may be disposed in the second insulating layer 350_2. The transmission lines 365 may provide interconnection between the drain contact 305, gate contact 310, and source contact 315 and other parts of the HEMT device 300A. Respective ones of the transmission lines 365 may directly contact respective ones of the drain contact 305 and/or source contact 315. The transmission lines 365 may contain metal or other highly conductive material, including, for example, copper, cobalt, gold, and/or a composite metal. For ease of illustration, the first and second insulating layers 350_1, 350_2, the field plates 312, and the transmission lines 365 are not illustrated in FIG. 2A.

The multi-layer environmental encapsulation stack 220 may be formed on the field plate 312, the transmission lines 365, and the first and second insulating layers 350_1, 350_2. The multi-layer environmental encapsulation stack 220 may include the first encapsulation layer 225 that is conformal and the second encapsulation layer 230 that is self-planarized and/or cured. For ease of illustration, multi-layer environmental encapsulation stack 220 is not illustrated in FIG. 2A.

The characteristics and content of the first encapsulation layer 225 and the second encapsulation layer 230 may be substantially similar to those of the semiconductor device 300 described herein and, as such, a duplicate description thereof will be omitted.

For example, the upper surface 230A of the second encapsulation layer 230 may be substantially planar across the width of the HEMT device 300A. The thickness Tc of the first encapsulation layer 225, the thicknesses of the regions Tg, Tm, Tr of the second encapsulation layer 230, and the ratio Tc to Tg, Tm, or Tr may be constructed to match those of Table 1.

A HEMT device 300A including the multi-layer environmental encapsulation stack 220 may perform advantageously as compared to related devices. For example, FIGS. 3A to 3D are graphs illustrating advantageous performance of devices according to embodiments of the present disclosure. In FIGS. 3A to 3D, a HEMT device similar to HEMT device 300A was utilized having a multi-layer environmental encapsulation stack 220 including the conformal first encapsulation layer 225 and the planar second encapsulation layer 230 (e.g., having a planar surface) as compared to conventional HEMT devices having non-planar protective layers. In FIGS. 3A to 3D, the first encapsulation layer 225 included an SiON:SiN bilayer and the second encapsulation layer 230 included a polyimide.

Figure 3A:
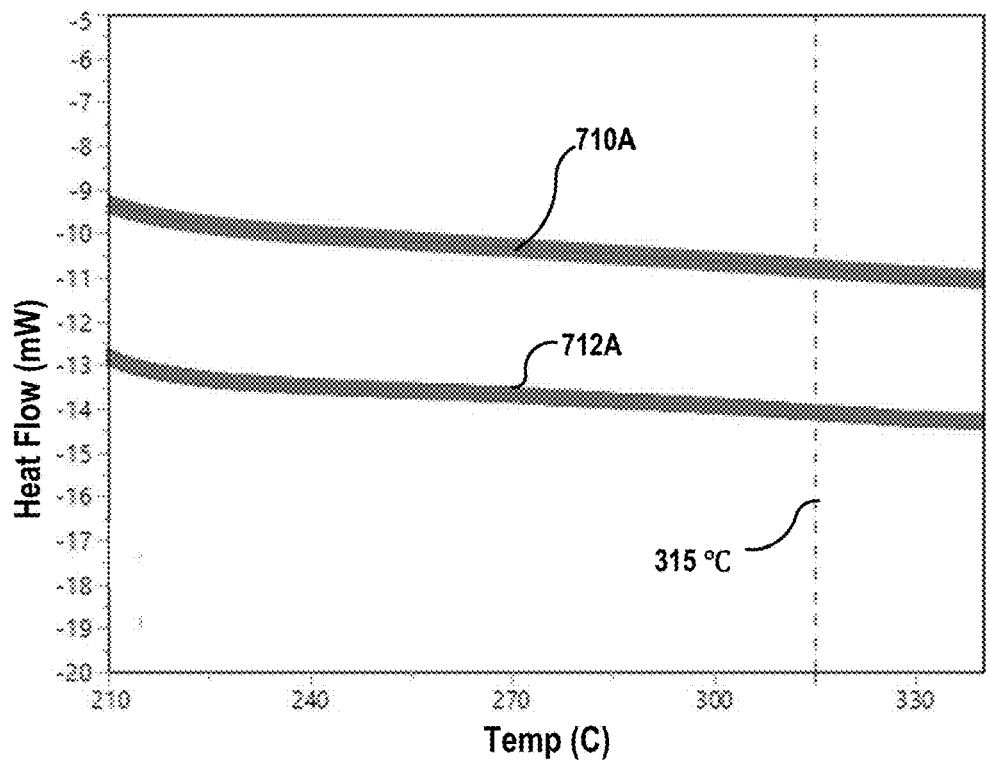
FIGS. 3A to 3D are graphs illustrating advantageous performance of devices according to embodiments of the present disclosure.

Referring to FIG. 3A, a differential scanning calorimetry graph is illustrated showing a comparison of the performance of a device including a multi-layer environmental encapsulation stack 220 including the first encapsulation layer 225 and the planar second encapsulation layer 230 (curve 710A) as compared to conventional HEMT device having non-planar protective layers (curve 712A). Differential scanning calorimetry (DSC) is a thermoanalytical technique in which the difference in the amount of heat required to increase the temperature of a sample and reference is measured as a function of temperature.

In FIG. 3A, curve 710A represents a device including the first encapsulation layer 225 implemented as a SiON:SiN bilayer and the second encapsulation layer 230 including a polyimide, where the device was cured for one hour at 250° C. The glass transition temperature of the polyimide was 225° C. Thus, the film was cured at a temperature that was above the glass transition temperature of the second encapsulation layer 230. The second encapsulation layer 230 has a cure temperature of less than 250° C. and thus was completely cured.

In contrast, curve 712A represents a device including a conventional film not having the conformal first encapsulation layer 225 and the planar second encapsulation layer 230 as described herein. The conventional film of curve 712A has a glass transition temperature of 350° C. The device associated with curve 712A was cured for one hour at 275° C. The cure temperature of the conventional material was such that it was unable to be fully cured during the one hour at 275° C. The DSC analysis was performed after the hour cure time was completed for both films.

As illustrated in FIG. 3A, both films show little film transition up to the die attach temperature of 315° C.

Figure 3B:
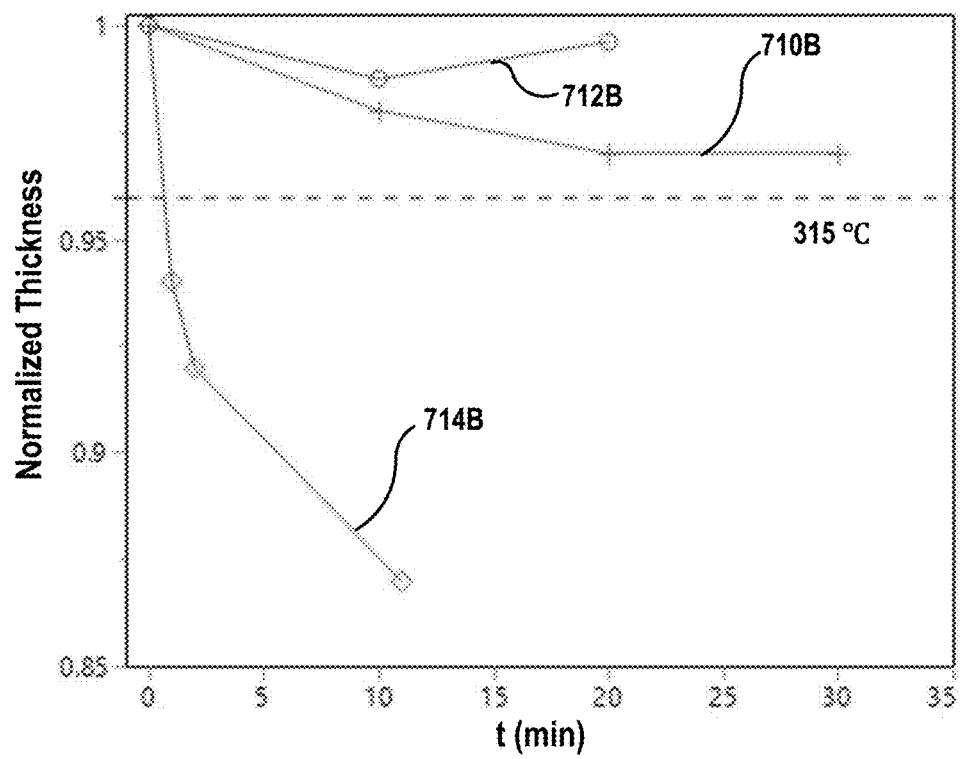

Referring to FIG. 3B, a graph of die attach film loss illustrates a variance in a normalized thickness of the multi-layer environmental encapsulation stack 220 as a function of time spent at 315° C., which is consistent with die attach processing temperatures. In FIG. 3B, curve 710B represents the same multi-layer environmental encapsulation stack 220 according to embodiments of the present disclosure illustrated in curve 710A of FIG. 3A, curve 712B represents the same conventional film stack illustrated by curve 712A in FIG. 3A, and curve 714B represents an additional conventional film not having the conformal first encapsulation layer 225 and the planar/cured second encapsulation layer 230 as described herein.

As illustrated in FIG. 3B, curve 710B representing the multi-layer environmental encapsulation stack 220 illustrates less than 5% variation in normalized thickness over 30 minutes at 315° C. In contrast, curve 714B illustrating a conventional film displays much more variation over slightly more than 10 minutes. Curve 712B, also a conventional film, behaves similarly to the device including the multi-layer environmental encapsulation stack 220. Thus, the multi-layer environmental encapsulation stack 220 performs at least as good as some conventional device films, and much better than others, with respect to minimizing a variation in the multi-layer environmental encapsulation stack 220 at relatively high temperatures.

Figure 3C:
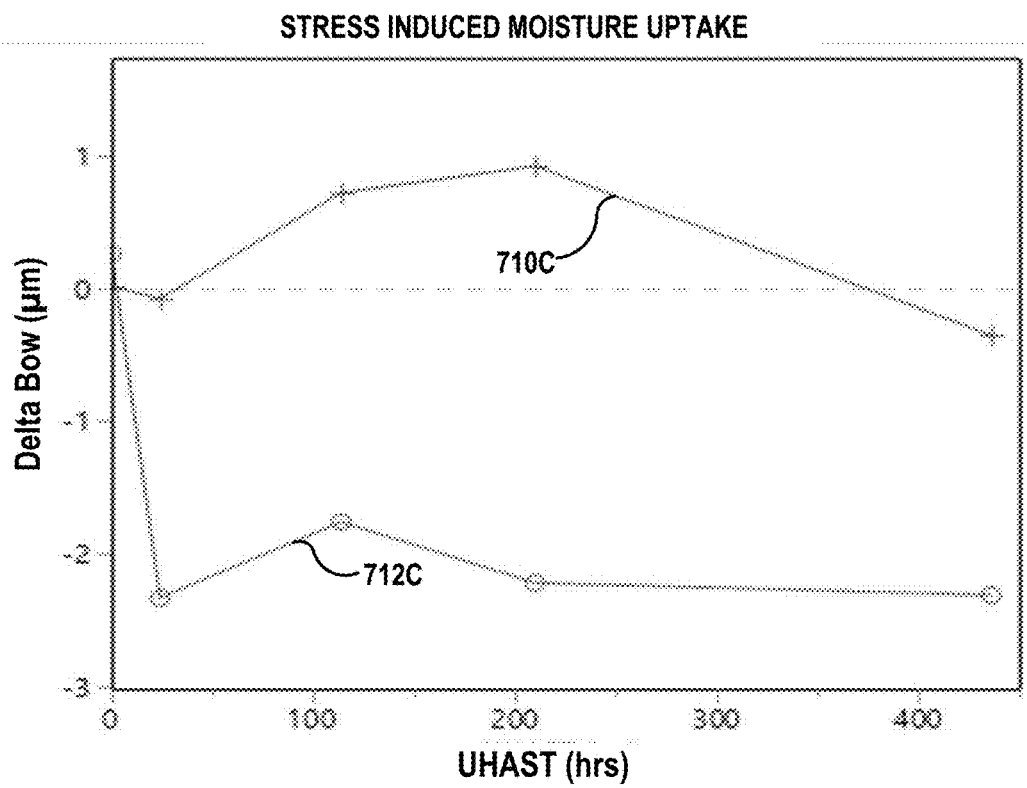

Referring to FIG. 3C, a graph of stress induced moisture uptake illustrates a variance in a bowing of a wafer during an unbiased highly accelerated stress test (UHAST) operation. In FIG. 3C, curve 710C represents the same multi-layer environmental encapsulation stack 220 according to embodiments of the present disclosure illustrated by curve 710A in FIG. 3A and curve 712C represents the same conventional film stack illustrated by curve 712A in FIG. 3A.

As illustrated in FIG. 3C, curve 710C representing the multi-layer environmental encapsulation stack 220 illustrates less than 1 μm of bowing during over 400 hours of UHAST testing. In contrast, curve 712C illustrating the conventional film displays over 2 μm of bowing at less than 100 hours. The improved performance is believed to be, in part, due to improved humidity protection provided by the planar second encapsulation layer 230 of the multi-layer environmental encapsulation stack 220. Thus, the multi-layer environmental encapsulation stack 220 provides improved environmental protection as compared to conventional device films.

Figure 3D:
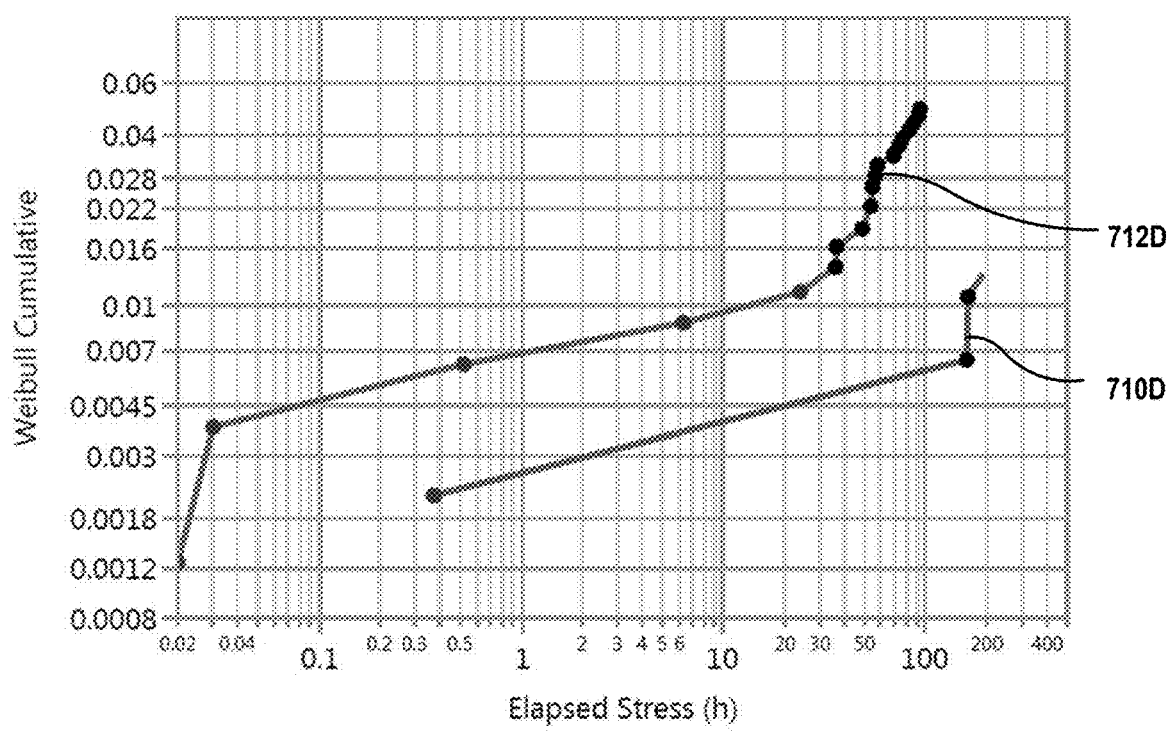

Referring to FIG. 3D, a graph of a Weibull analysis of reliability data for failures during stress testing (e.g., HAST testing). In FIG. 3D, curve 710D represents the same multi-layer environmental encapsulation stack 220 according to embodiments of the present disclosure illustrated by curve 710A in FIG. 3A and curve 712D represents the same conventional film stack illustrated in by curve 712A in FIG. 3A.

As illustrated in FIG. 3D, curve 710D representing the multi-layer environmental encapsulation stack 220 illustrates improved reliability over at least the first 100 hours of stress testing as compared to conventional devices. For example, the devices represented by curve 710D encountered only one failure out of 232 samples of 96 hours of HAST testing, which represents a lot tolerance percent defective (LTPD) of less than two. Similarly, the devices represented by curve 710D encountered no failures out of 223 samples of 2000 hours of temperature-humidity-bias THB testing, which represents an LTPD of less than one. Thus, the multi-layer environmental encapsulation stack 220 provides improved product reliability as compared to conventional device films.

FIGS. 4A to 4K illustrate a method of fabricating a semiconductor device, such as the HEMT device 300A of FIGS. 2A and 2B, according to embodiments of the present disclosure. FIGS. 4A to 4K are taken along line B-B of FIG. 2A.

Referring now to FIG. 4A, a substrate 122 is provided on which a semiconductor structure may be formed. A channel layer 324 is formed on the substrate 122, and a barrier layer 326 is formed on the channel layer 324. The substrate 122 may be a semi-insulating silicon carbide (SiC) substrate that may be, for example, the 4H polytype of silicon carbide. Other silicon carbide candidate polytypes may include the 3C, 6H, and 15R polytypes. A thickness of the substrate 122 may be 100 μm or greater.

Silicon carbide has a much closer crystal lattice match to Group III nitrides (which may be employed in the channel layer 324 and/or the barrier layer 326) than does sapphire ($Al_2O_3$), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire and/or silicon. Also, semi-insulating silicon carbide substrates may provide for device isolation and reduced parasitic capacitance.

It is to be understood that, although silicon carbide may be employed as a substrate, embodiments of the present invention may utilize any suitable substrate for the substrate 122, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like.

Optional buffer, nucleation and/or transition layers (not shown) may also be provided on the substrate 122. For example, an AlN buffer layer may be provided to provide an appropriate crystal structure transition between a silicon carbide substrate and the remainder of the device. Additionally, strain balancing transition layer(s) may also be provided.

Still referring to FIG. 4A, a channel layer 324 is provided on the substrate 122. The channel layer 324 may be deposited on the substrate 122 using buffer layers, transition layers, and/or nucleation layers as described above. The channel layer 324 may be under compressive strain. Furthermore, the channel layer 324 and/or buffer, nucleation, and/or transition layers may be deposited by MOCVD, MBE, and/or HYPE. In some embodiments of the present invention, the channel layer 324 may be a Group III-nitride layer.

The barrier layer 326 may be a Group III-nitride layer. In certain embodiments of the present invention, the barrier layer 326 may be a highly-doped n-type layer. For example, the barrier layer 326 may be doped to a concentration of less than about $10^{19}$ cm$^{-3}$.

In some embodiments of the present invention, the barrier layer 326 may have a thickness, Al composition, and/or doping sufficient to induce a significant carrier concentration at the interface between the channel layer 324 and the barrier layer 326 through polarization effects when the barrier layer 326 is buried under ohmic contact metal. Also, the barrier layer 326 may be thick enough to reduce or minimize scattering of electrons in the channel due to ionized impurities deposited at the interface between the barrier layer 326 and a subsequently formed first protective layer.

In some embodiments, the channel layer 324 and the barrier layer 326 may have different lattice constants. For example, the barrier layer 326 may be a relatively thin layer having a smaller lattice constant than the channel layer 324, such that the barrier layer 326 "stretches" at the interface between the two. Accordingly, a pseudomorphic HEMT (pHEMT) device may be provided.

Referring to FIG. 4B, a first protective layer 410 is formed on the barrier layer 326. The first protective layer 410 may be dielectric material, such as silicon nitride ($Si_xN_y$), aluminum nitride (AlN), silicon dioxide ($SiO_2$), and/or other suitable protective material. Other materials may also be utilized for the first protective layer 410. For example, the first protective layer 410 may also include magnesium oxide, scandium oxide, aluminum oxide and/or aluminum oxynitride. Furthermore, the first protective layer 410 may be a single layer or may include multiple layers of uniform and/or non-uniform composition.

The first protective layer 410 may be blanket formed on the barrier layer 326. For example, the first protective layer 410 may be a silicon nitride (SiN) layer formed by high quality sputtering and/or plasma-enhanced chemical vapor deposition (PECVD), The first protective layer 410 may be sufficiently thick so as to protect the underlying barrier layer 326 during a subsequent anneal of ohmic contacts.

Figure 4C:
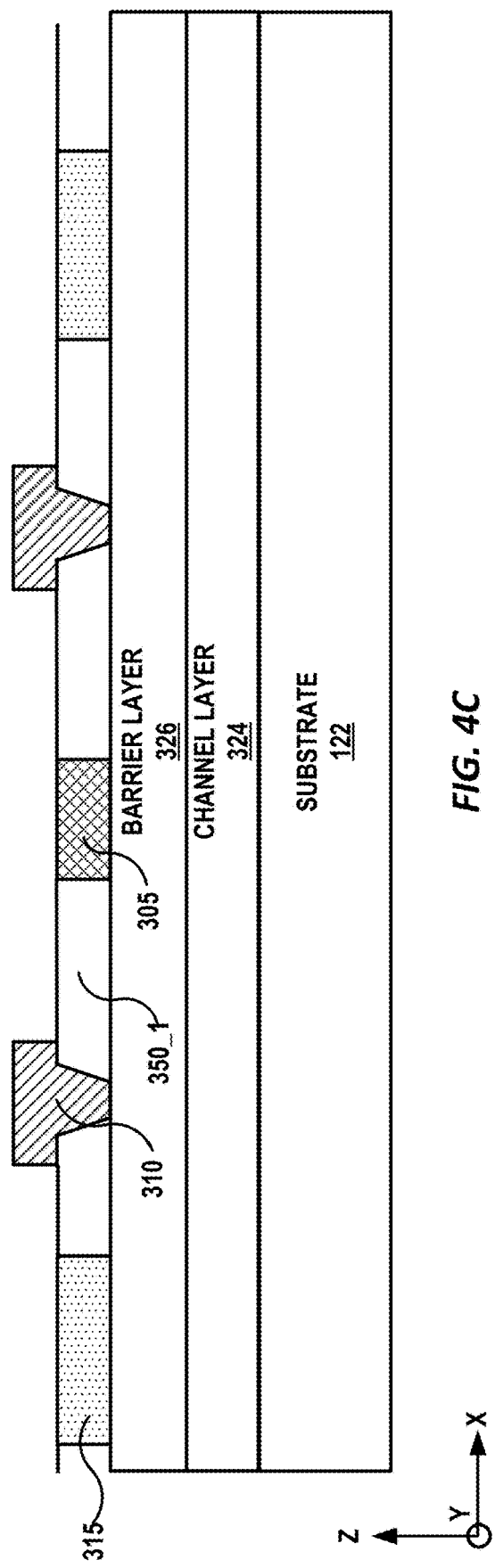

Referring to FIG. 4C, the first protective layer 410 (see FIG. 4B) may be patterned to form source contacts 315, gate contacts 310, and drain contacts 305. For example, the first protective layer 410 may be patterned to form windows which expose the barrier layer 326 for placement of the source contact 315 and the drain contacts 305. The windows may be etched utilizing a patterned mask and a low-damage etch with respect to the barrier layer 326. Ohmic metal may be formed on the exposed portions of the barrier layer 326. The ohmic metal may be annealed to provide the source contacts 315 and the drain contacts 305.

The first protective layer 410 may also be patterned to provide the gate contacts 310. The first protective layer 410 may be etched to form windows which expose the barrier layer 326 for placement of the gate contact 310. The gate contacts 310 may be formed within the etched windows, and may extend through the first protective layer 410 to contact the exposed portion of the barrier layer 326. Suitable gate materials may depend on the composition of the barrier layer 326. However, in certain embodiments, conventional materials capable of making a Schottky contact to a nitride-based semiconductor material may be used, such as Ni, Pt, $NiSi_x$, Cu, Pd, Cr, TaN, W, and/or WSiN. Portion of the gate contacts 310 may extend on a surface of the first protective layer 410. The formation of the source contacts 315, gate contacts 310, and drain contacts 305 may result in the patterning of the first protective layer 410 of FIG. 4B to form the first insulating layer 350_1.

Though the source contact 315 is illustrated as being on the top surface of the barrier layer 326 in FIG. 4C, it will be understood that, in some embodiments, the source contacts 315, gate contacts 310, and/or drain contacts 305 may be formed within recesses in the top surface of the barrier layer 326.

Figure 4D:
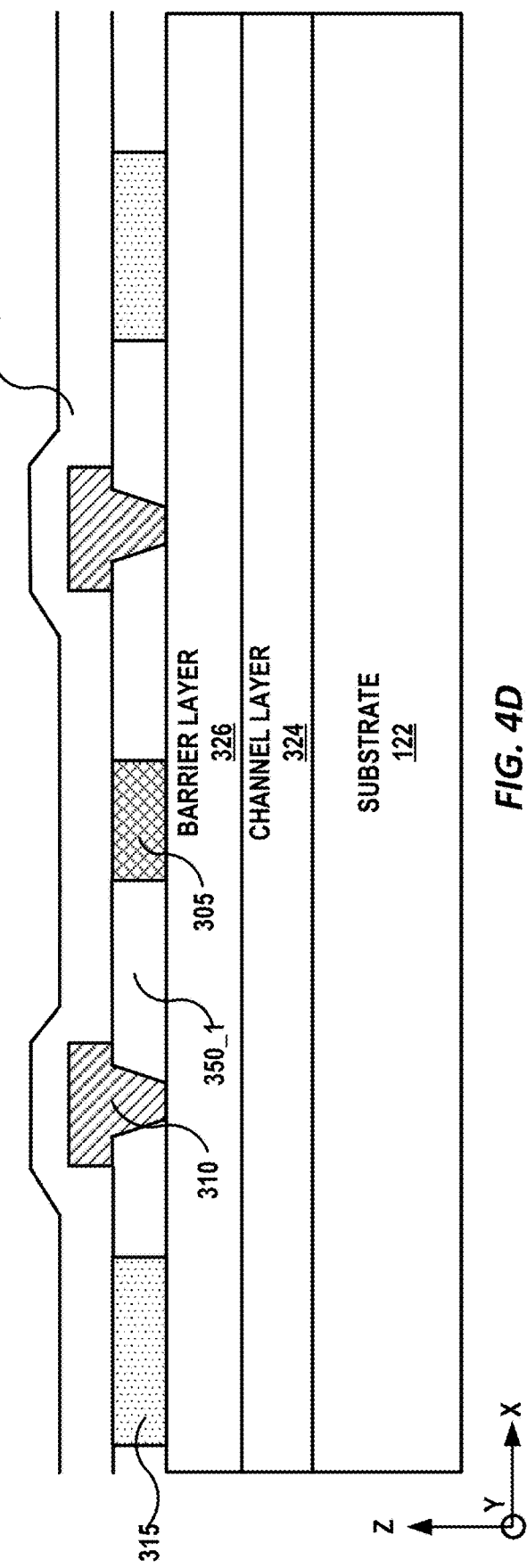

Referring to FIG. 4D, a second protective layer 420 may be formed on the first insulating layer 350, the source contacts 315, gate contacts 310, and drain contacts 305. The second protective layer 420 may be a dielectric layer. In some embodiments, the second protective layer 420 may have a different dielectric index than the first insulating layer 350_1.

Referring to FIG. 4E, field plates 312 may be formed on the second protective layer 420. The field plate 312 may overlap the gate contact 310 (e.g., in the Z direction of FIG. 4E) and may extend a distance on the region between the gate and the drain (i.e., the gate-drain region). An overlap of the field plate 312 over the gate contact 310 and/or the distance the field plate 312 extends on the gate-drain region can be varied for optimum results. In some embodiments, the field plate 312 can be electrically connected to the gate contact 310 or the source contact 315, and it is understood that field plate structures other than those illustrated in the figures may be used without deviating from the invention.

Referring to FIG. 4F, the second protective layer 420 may be patterned to form the transmission lines 365. For example, the second protective layer 420 may be patterned to form windows which expose the source contacts 315 and/or the drain contacts 305 for placement of the transmission lines 365. The windows may be etched utilizing a patterned mask and a low-damage etch with respect to the source contacts 315 and/or the drain contacts 305. Conductive metal may be formed on the exposed portions of the source contacts 315 and/or the drain contacts 305 to form the transmission lines 365. The formation of the transmission lines 365 may result in the patterning of the second protective layer 420 of FIG. 4E to form the second insulating layer 350_2.

Figure 4G:
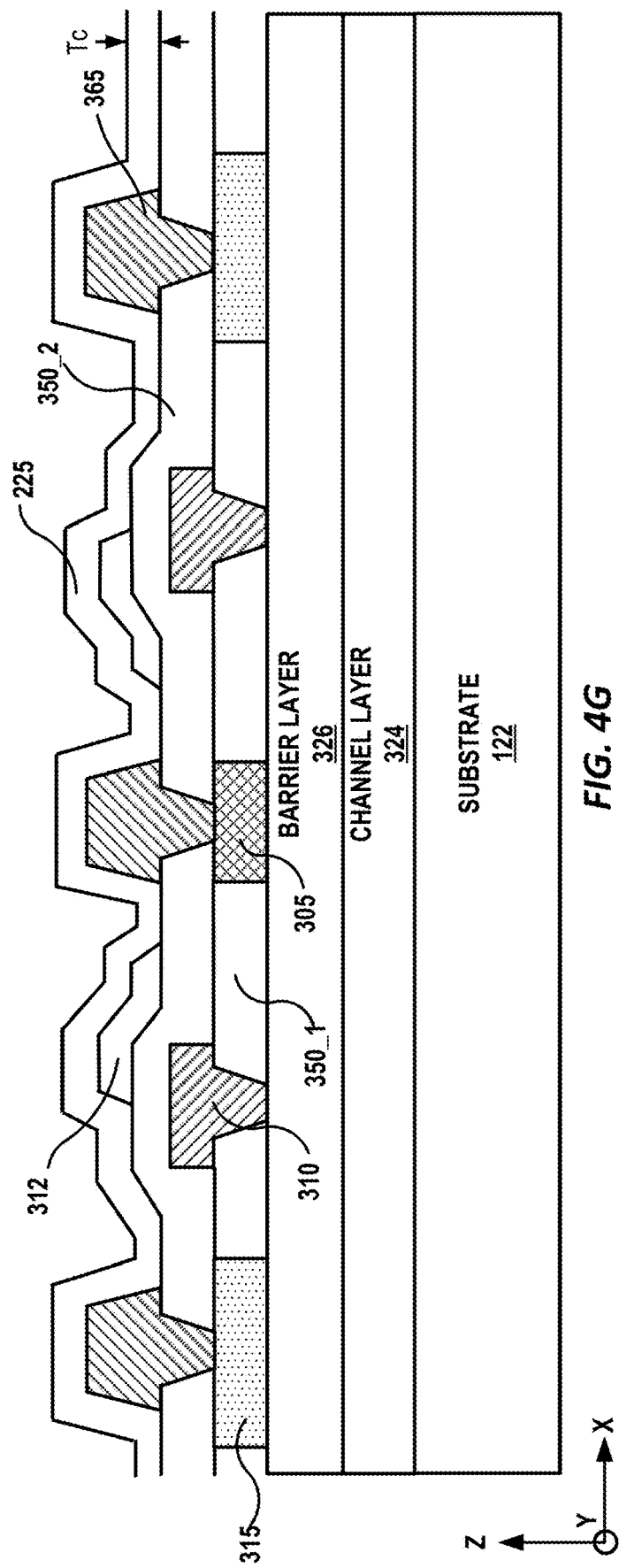

Referring to FIG. 4G, a conformal first encapsulation layer 225 may be formed on the field plate 312, the transmission lines 365, and/or the first and second insulating layers 350_1, 350_2. An upper surface of the first encapsulation layer 225 may be non-planar.

The first encapsulation layer 225 may be or include one or more dielectric layers. The first encapsulation layer 225 may include, for example, SiO, SiN, SiON, ZrO, HfO, AlN and/or AlO. In some embodiments, the first encapsulation layer 225 may include multiple layers. For example, the first encapsulation layer 225 may include a SiON:SiN bilayer. A thickness Tc the first encapsulation layer 225 may be conformal and substantially uniform across the semiconductor device, but the embodiments of the present disclosure are not limited thereto. The first encapsulation layer 225 may be deposited using wafer-level processing methods such as CVD, PECVD, ALD, or PVD.

Figure 4H:
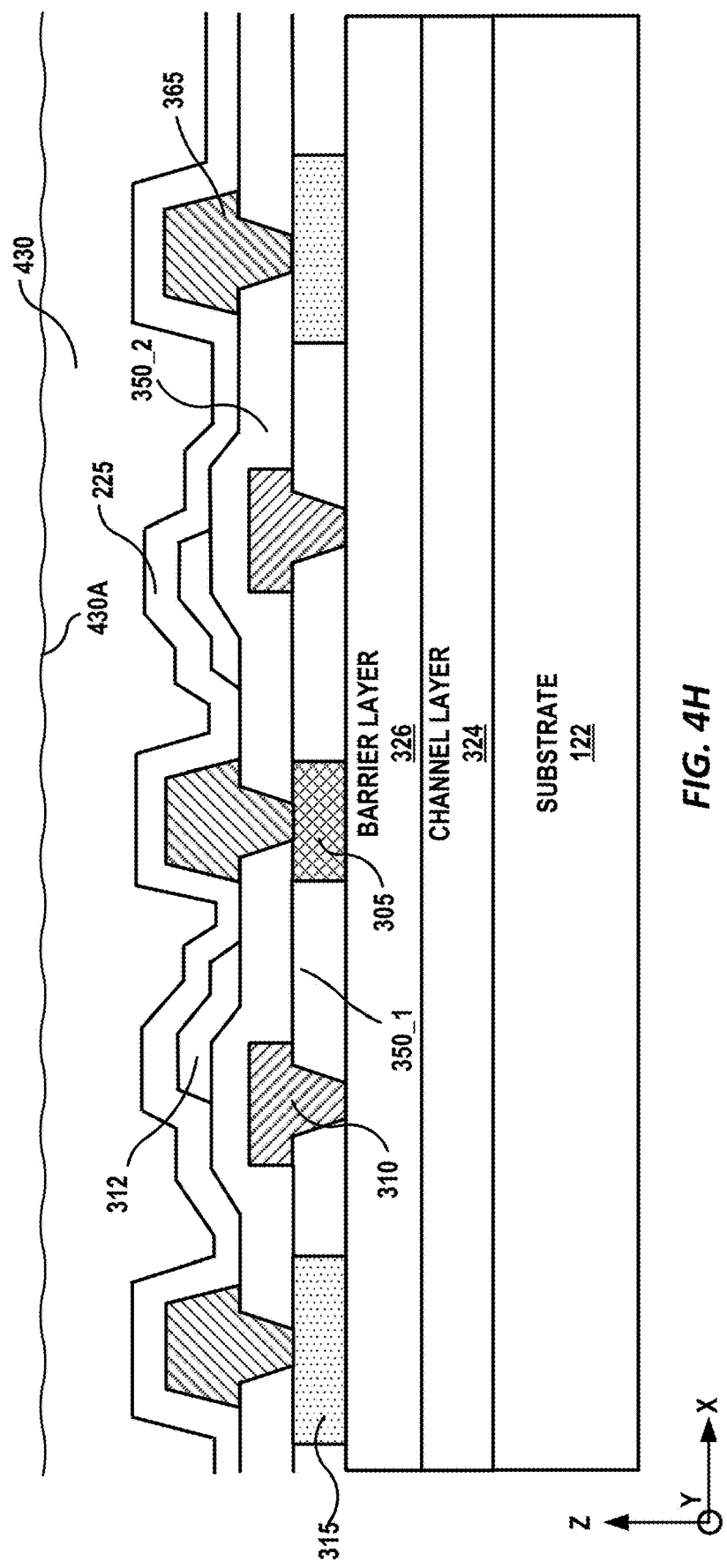

Referring to FIG. 4H, an uncured layer 430 may be formed on the first encapsulation layer 225 such that the first encapsulation layer 225 is between the uncured layer 430 and the field plate 312, the transmission lines 365, and/or first and second insulating layers 350_1, 350_2. The uncured layer 430 may be a curable dielectric layer formed in a viscous or liquid state, for example, by a spin-on, spray-on, vapor deposition, electroplating, blade-coating or slot-die deposition process.

The uncured layer 430 may include, for example, polyimide, benzocyclobutene (BCB), glass (e.g., borosilicate glass (BSG)), polyamide, polybenzoxazole (PBO), and/or a photoresist (e.g., SU-8). Other epoxies and/resins may be used without deviating from the embodiments of the present disclosure. In some embodiments, the material of the uncured layer 430 may be selected to have a kinematic viscosity of 100 to 8000 cSt. In some embodiments, the material of the uncured layer 430 may be selected to have a kinematic viscosity of 1000 to 2000 cSt.

An upper surface 430A of the uncured layer 430 may be non-planar. That is to say that since the uncured layer 430 has not yet cured, the upper surface 430A of the uncured layer 430 may include (at least initially) variations, surface irregularities, and/or deviations. Due to a viscosity of the uncured layer 430, the uncured layer 430 may flow into openings and/or other deviations in the surface of the first encapsulation layer 225. In addition, in some embodiments, the viscosity of the uncured layer 430 may allow the upper surface 430A of the uncured layer 430 to self-planarize.

Figure 4I:
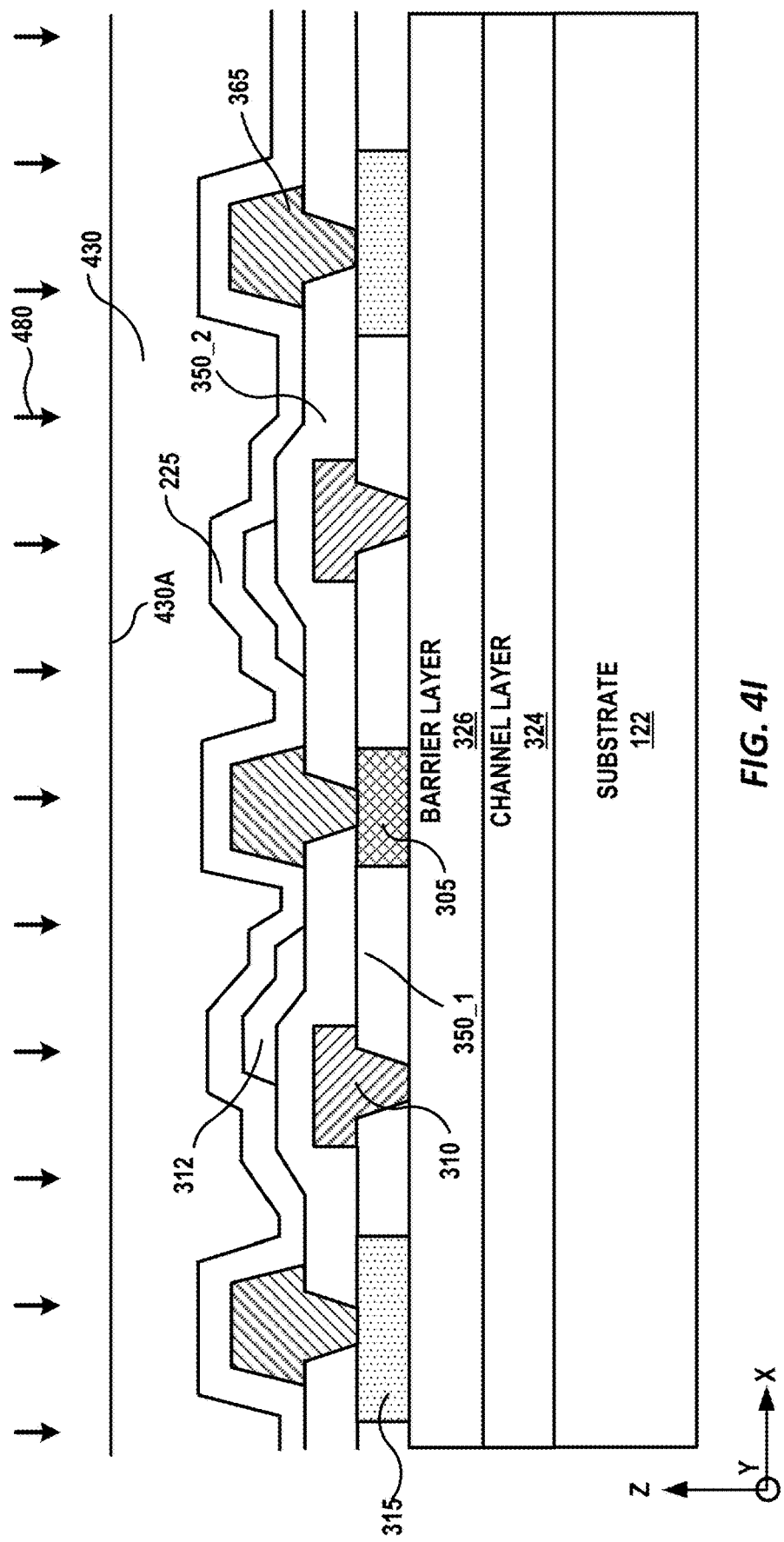

Referring to FIG. 4I, a curing process 480 may be performed on the uncured layer 430. The curing process 480 may include, for example, the application of heat, but the embodiments of the present disclosure are not limited thereto. In some embodiments, the curing process 480 may be performed at a temperature of less than 275° C. In some embodiments, the curing process 480 may be performed at a temperature of less than or equal to 250° C. The material of the uncured layer 430 may be selected to have a cure temperature of less than 275° C. and, in some embodiments, less than 250° C. Thus, as a result of the curing process 480, the uncured layer 430 may be substantially and/or completely cured. In some embodiments, the curing process 480 may include, for example, the application of particular wavelengths of light, such as ultraviolet (UV) light.

In some embodiments, the curing process 480 may be performed at a temperature that is greater than a glass transition temperature of the material of the uncured layer 430. In some embodiments, the material of the uncured layer 430 may be selected to have a glass transition temperature of less than 250° C. (e.g., 225° C.), and the curing process 480 may be performed at 250° C. for one hour.

In FIG. 4I, the upper surface 430A of the uncured layer 430 is illustrated as planar. In some embodiments, the viscosity of the uncured layer may allow the upper surface 430A of the uncured layer 430 to transition from the non-planar surface illustrated in FIG. 4H to the planar surface illustrated in FIG. 4I (i.e., self-planarize). In some embodiments, the transition from the non-planar surface illustrated in FIG. 4H to a planar surface may occur during the curing process 480 illustrated in FIG. 4I.

Figure 4J:
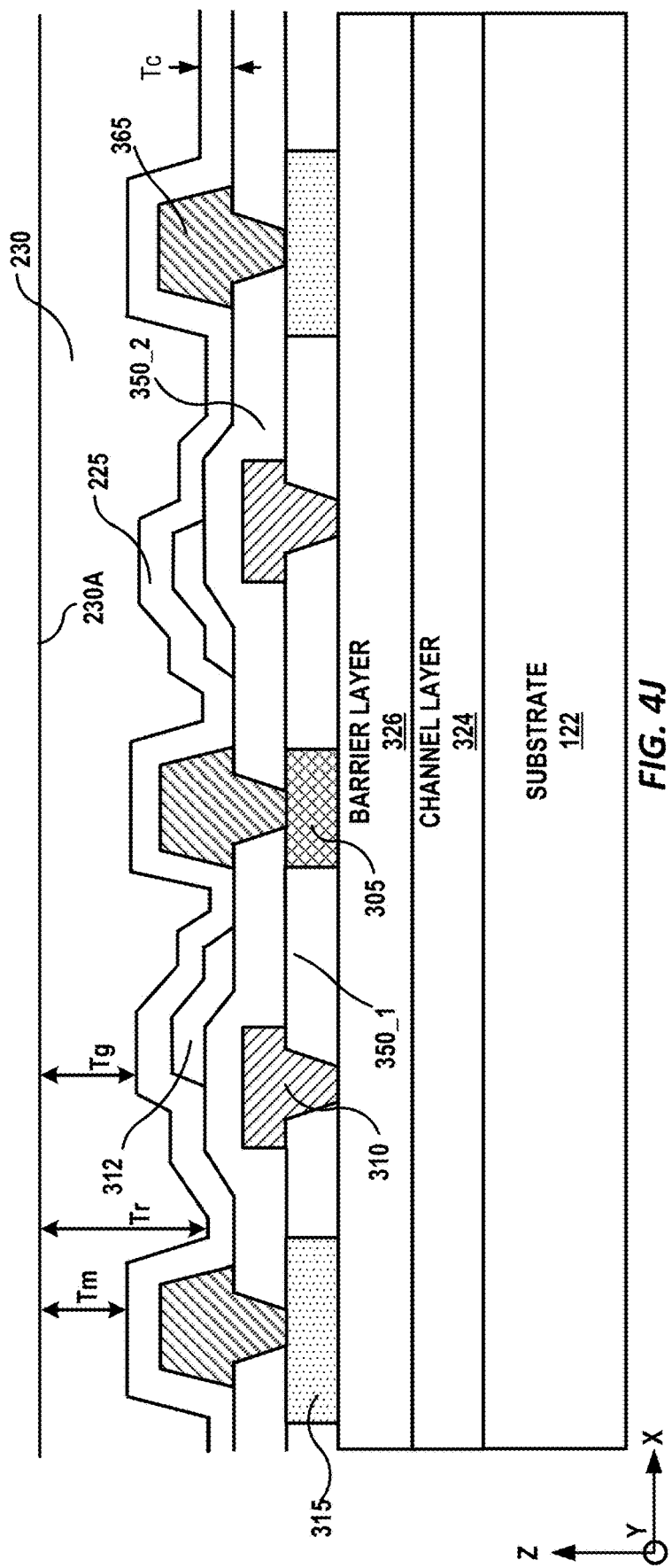

Referring to FIG. 4J, as a result of the curing process 480, the uncured layer 430 may be transformed into the planar and/or cured second encapsulation layer 230. An upper surface 230A of the second encapsulation layer 230 may be substantially planar across the width of the device. As a result of the curing, the upper surface 230A of the second encapsulation layer 230 may be self-planarized. That is, the upper surface 430A of the uncured layer 430 including variations, surface irregularities, and/or deviations may be transformed into the upper surface 230A of the second encapsulation layer 230 that is substantially planar and/or cured as a result of the curing process. Thus, the planar upper surface 230A may be provided without the need for a planarization step. In some embodiments, the thickness Tc of the first encapsulation layer 225, the thicknesses of the regions Tg, Tm, Tr of the second encapsulation layer 230, and a ratio of the thickness Tc to Tg, Tm, or Tr of the second encapsulation layer 230 may be constructed to match those of Table 1.

Figure 4K:
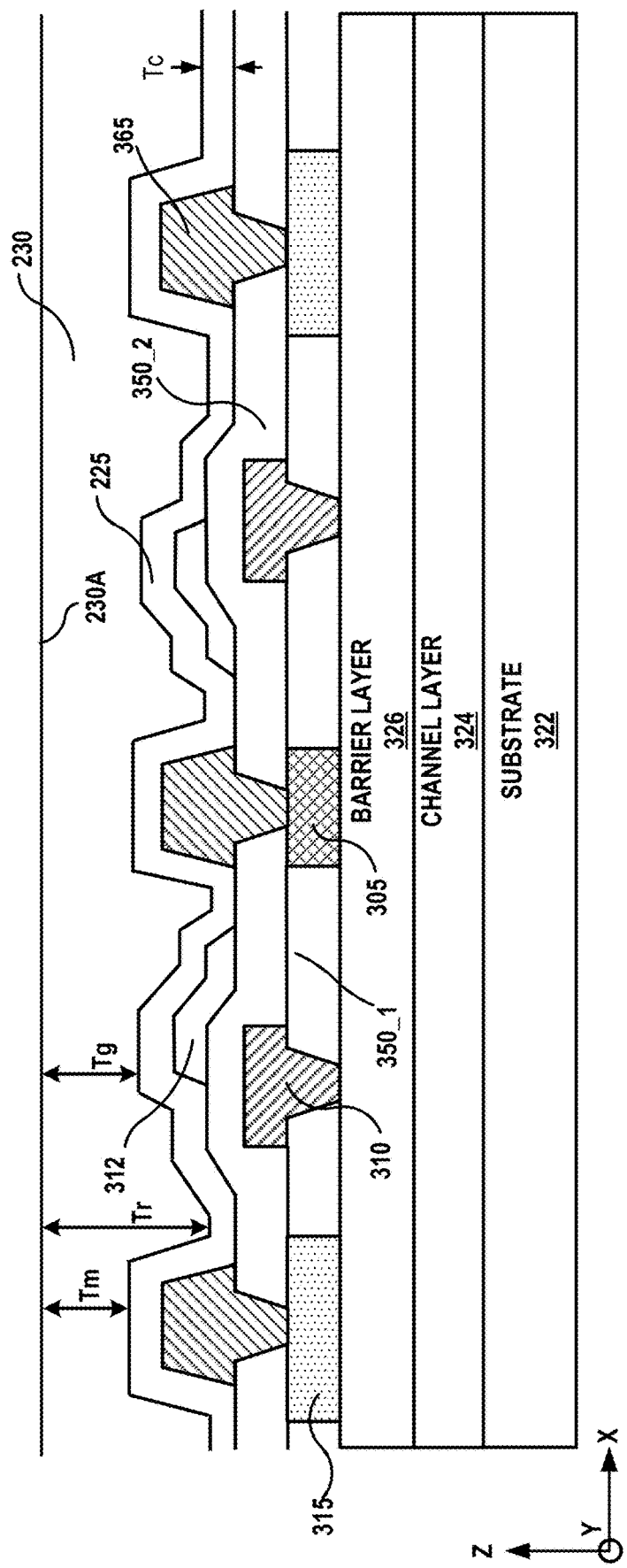

Referring to FIG. 4K, the substrate 122 (see FIG. 4J) may be thinned to form the thinned substrate 322. In some embodiments, the thickness of the substrate 322 is reduced using a grinder, such as, an in-feed or creep feed grinder. In other embodiments, the thickness of the substrate 322 is reduced using lapping, chemical or reactive ion etching or combinations of these approaches with or without grinding. In still other embodiments, etching may be used to treat the backside of the substrate 322 to reduce damage to the substrate 322 that may result from the thinning operation. Methods of thinning a wafer are described, for example, in commonly assigned U.S. Pat. Nos. 7,291,529, 7,932,111; 7,259,402; and U.S. Pat. No. 8,513,686, the disclosures of which are incorporated herein by reference in their entirety.

In some embodiments according to the invention, the substrate 322 is thinned to a thickness of between about 40 µm to about 100 µm. In other embodiments, the substrate 322 is thinned to a thickness of between about 40 µm to about 75 µm.

In some embodiments, the thinning of the substrate 122 is omitted, and the substrate 122 is effectively identical to the substrate 322. Though FIG. 4K illustrates the substrate 122 being thinned after the forming of the multi-layer environmental encapsulation stack 220 including the first encapsulation layer 225 and the second encapsulation layer 230, the embodiments of the present disclosure are not limited thereto. In some embodiments, the thinning of the substrate 122 may occur at other points in the processing, such as before the forming of the multi-layer environmental encapsulation stack 220.

Referring back to FIG. 2B, via 325 may be formed in the substrate 322, the channel layer 324 and the barrier layer 326. The via 325 may be formed by wet or dry etching. In some embodiments, the via 325 may be anisotropically etched such that sidewalls of the via 325 are inclined with respect to a top surface of the substrate 322. In some embodiments, the via 325 may expose a bottom surface of the source contact 315. In some embodiments, the source contact 315 may serve as an etch stop material during the formation of the via 325. After formation of the via, backmetal layer 335 may be deposited on the lower surface 322A of the substrate 322, sidewalls of the via 325, and the bottom surface of the source contact 315. The backmetal layer 335 may include a conductive metal such as, for example, titanium, platinum, and/or gold.

Figure 5A:
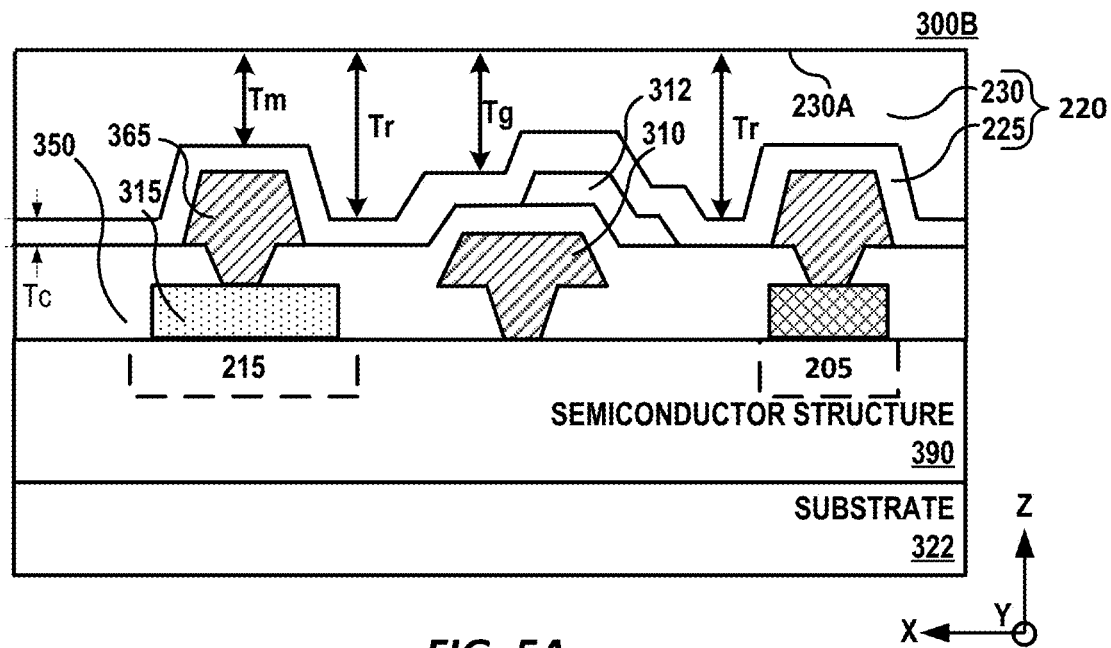
FIGS. 5A and 5B are schematic cross-sectional views of alternative transistor device structures, according to some embodiments of the present disclosure
Figure 5B:
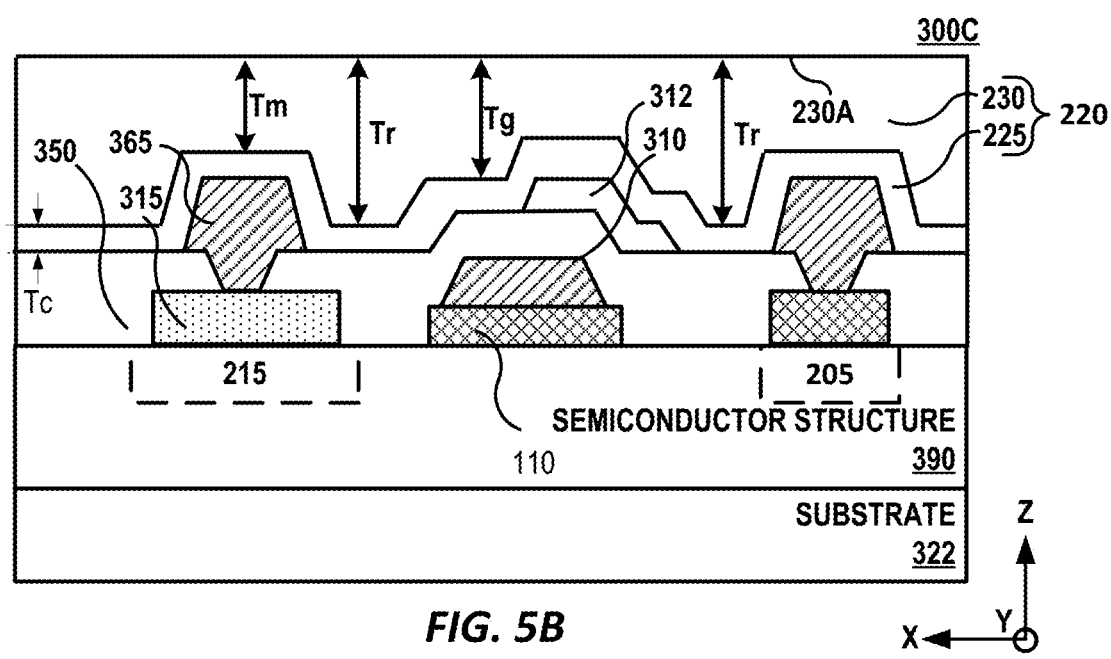

Though a HEMT device 300A was illustrated in FIGS. 4A to 4K, it will be understood that the multi-layer environmental encapsulation stack 220 described with respect to FIGS. 4A to 4K may be provided using other types of semiconductor devices. Stated another way, other types of semiconductor devices may be used, and the methods of forming the environmental encapsulation stack 220 including the first encapsulation layer 225 and the second encapsulation layer 230 described herein (e.g., FIGS. 4G to 4J) may be applied to the semiconductor device without deviating from the scope of the present disclosure. FIGS. 5A to 5B illustrate example semiconductor devices 300B, 300C that can include the multi-layer environmental encapsulation stack 220 described herein. A duplicate description of elements of FIGS. 5A and 5B that have been described previously will be omitted for brevity. FIGS. 5A and 5B are taken generally along the lines A-A of FIG. 2A. However, it will be understood that the embodiments of the present disclosure are not limited to those of FIGS. 2B, 5A, and 5B and, in general, the methods/structures of the present disclosure can be applied and an encapsulation stack to any semiconductor device having elements on its upper surface having upper surfaces at varying heights.

FIG. 5A illustrates a Metal-Semiconductor Field Effect Transistor (MESFET) device 300B, where the region of the semiconductor structure 390 between the source and drain regions 215 and 205 provides the conduction channel or channel region of the MESFET 300B. FIG. 5B illustrates a Metal-Oxide Semiconductor Field Effect Transistor (MOSFET) device 300C, where the region of the semiconductor structure 390 between the source and drain regions 215 and 205 provides the channel region of the MOSFET 300C, and the gate contact 310 is separated from the channel region by a gate oxide layer 110.

Each of the semiconductor devices 300B, 300C may include the multi-layer environmental encapsulation stack 220 on and protecting the device. In FIGS. 5A and 5B, the multi-layer environmental encapsulation stack 220 is shown having a similar structure (e.g., a conformal first encapsulation layer 225 and a self-planarized and/or cured second encapsulation layer 230) as that of the semiconductor devices 300, 300A illustrated in FIGS. 1 and 2B. The semiconductor devices 300B, 300C of FIGS. 5A and 5B may have similar ratios of thicknesses of the first encapsulation layer 225 and the second encapsulation layer 230 as described herein and provided in Table 1.

Though FIGS. 2A, 5A, and 5B illustrate embodiments in which the semiconductor devices have each of the source, drain, and gate contacts on an upper surface of the semiconductor device, the embodiments of the present disclosure are not limited thereto. Semiconductor devices including one or more contacts (e.g., a drain contact) on a bottom surface of the device may also incorporate the multi-layer environmental encapsulation stack 220 described herein (e.g., having a conformal first encapsulation layer 225 and a self-planarized and/or cured second encapsulation layer 230) without deviating from the scope of the present disclosure.

Figure 6A:
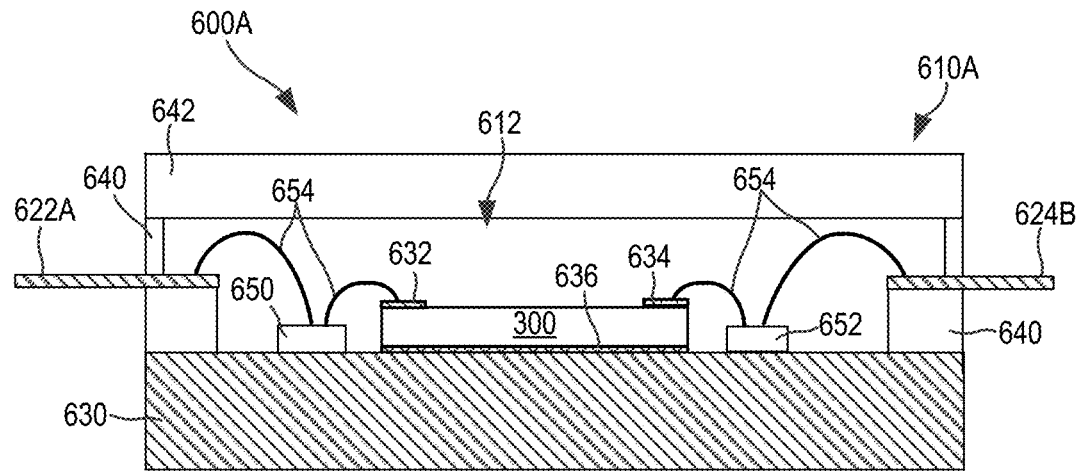
FIGS. 6A through 6C are schematic cross-sectional views illustrating several example ways that that a semiconductor according to embodiments of the present disclosure may be packaged.
Figure 6B:
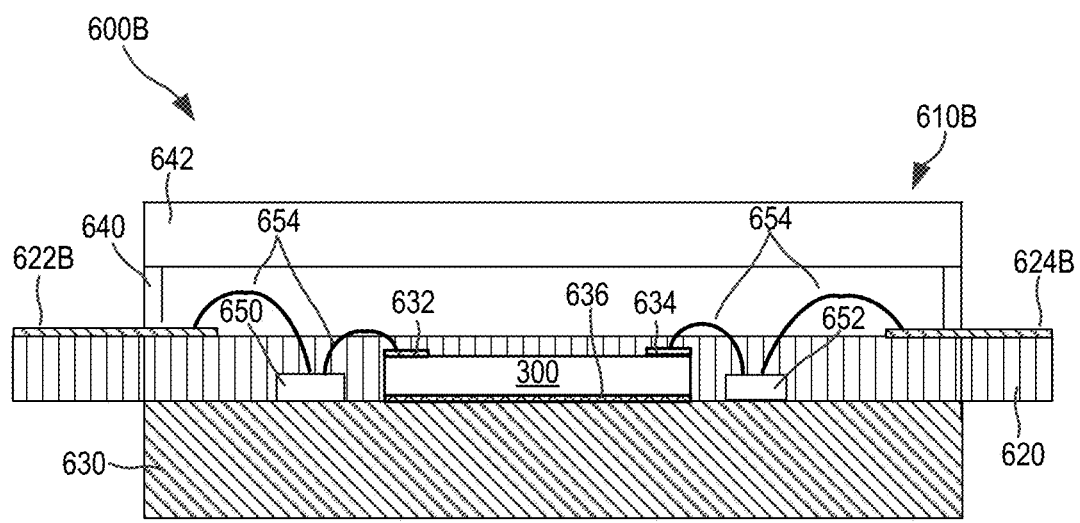
Figure 6C:
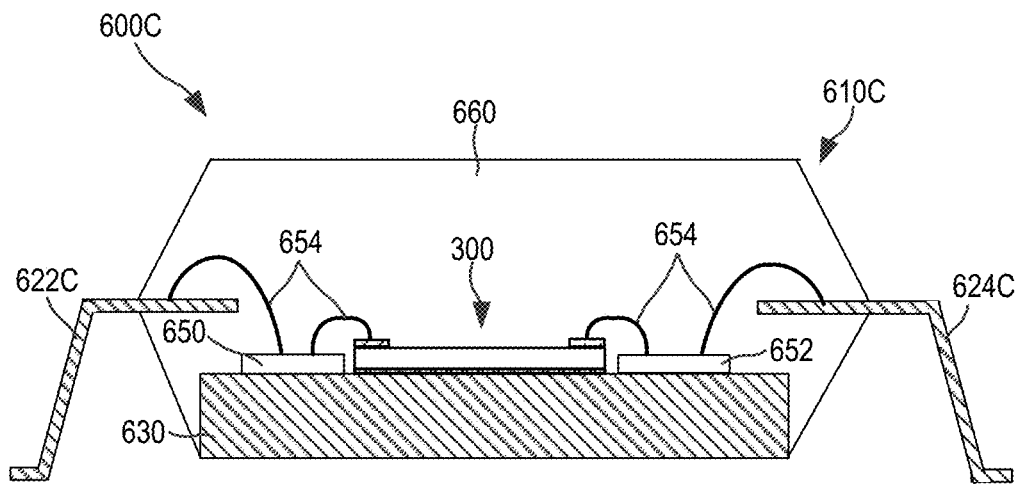

FIGS. 6A through 6C are schematic cross-sectional views illustrating several example ways that that the semiconductor device 300 according to embodiments of the present disclosure may be packaged to provide packaged transistor amplifiers 600A through 600C, respectively. While FIGS. 6A-6C show the semiconductor device 300 of FIG. 1 being packaged, it will be appreciated that any of the semiconductor devices 300A, 300B, 300C according to embodiments of the present disclosure may be packaged in the packages illustrated in FIGS. 6A-6C.

FIG. 6A is a schematic side view of a packaged transistor amplifier 600A. As shown in FIG. 6A, packaged transistor amplifier 600A includes the semiconductor device 300 packaged in an open cavity package 610A. The package 610A includes metal gate leads 622A, metal drain leads 624A, a metal submount 630, sidewalls 640 and a lid 642.

The submount 630 may include materials configured to assist with the thermal management of the packaged transistor amplifier 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials. In some embodiments, the sidewalls 640 and/or lid 642 may be formed of, for example, $Al_2O_3$. The lid 642 may be glued to the sidewalls 640 using an epoxy glue. The sidewalls 640 may be attached to the submount 630 via, for example, brazing. The gate lead 622A and the drain lead 624A may be configured to extend through the sidewalls 640, though embodiments of the present invention are not limited thereto.

The semiconductor device 300 is mounted on the upper surface of the metal submount 630 in an air-filled cavity 612 defined by the metal submount 630, the ceramic sidewalls 640 and the ceramic lid 642. Gate and drain terminals 632, 634 of the semiconductor device 300 may be on the top side of the semiconductor device 300, while a source terminal 636 may be on the bottom side of the semiconductor device 300. The source terminal 636 may be mounted on the metal submount 630 using, for example, a conductive die attach material (not shown). The metal submount 630 may provide the electrical connection to the source terminal 636 and may also serve as a heat dissipation structure that dissipates heat that is generated in the semiconductor device 300. The heat is primarily generated in the upper portion of the semiconductor device 300 where relatively high current densities are generated in, for example, the channel regions of the unit cell transistors. This heat may be transferred though the semiconductor structure 390 to the source terminal 636 and then to the metal submount 630.

Input matching circuits 650 and/or output matching circuits 652 may also be mounted within the package 610A. The matching circuits 650, 652 may include impedance matching and/or harmonic termination circuits. The impedance matching circuits may be used to match the impedance of the fundamental component of RF signals that are input to or output from the transistor amplifier 600A to the impedance at the input or output of the semiconductor device 300, respectively. The harmonic termination circuits may be used to ground harmonics of the fundamental RF signal that may be present at the input or output of the semiconductor device 300. More than one input matching circuit 650 and/or output matching circuit 652 may be provided. As schematically shown in FIG. 6A, the input and output matching circuits 650, 652 may be mounted on the metal submount 630. The gate lead 622A may be connected to the input matching circuit 650 by one or more bond wires 654, and the input matching circuit 650 may be connected to the gate terminal 632 of semiconductor device 300 by one or more additional bond wires 654. Similarly, the drain lead 624A may be connected to the output matching circuit 652 by one or more bond wires 654, and the output matching circuit 652 may be connected to the drain terminal 634 of semiconductor device 300 by one or more additional bond wires 654. The bond wires 654, which are inductive elements, may form part of the input and/or output matching circuits 650, 652.

FIG. 6B is a schematic side view of a packaged transistor amplifier 600B that includes the semiconductor device 300 of FIG. 1 packaged in a printed circuit board-based package 610B. The packaged transistor amplifier 600B is very similar to the packaged transistor amplifier 600A of FIG. 6A, except that the gate and drain leads 622A, 624A of package 610A are replaced with printed circuit board-based leads 622B, 624B in package 610B.

The package 610B includes a submount 630, ceramic sidewalls 640, a ceramic lid 642, each of which may be substantially identical to the like numbered elements of package 610A discussed above. The package 610B further includes a printed circuit board 620. Conductive traces on the printed circuit board 620 form a metal gate lead 622B and a metal drain lead 624B. The printed circuit board 620 may be attached to the submount 630 via, for example, a conductive glue. The printed circuit board 630 includes a central opening and the semiconductor device 300 is mounted within this opening on the submount 630. Other components of transistor amplifier 600B may be the same as the like-numbered components of transistor amplifier 600A, and hence further description thereof will be omitted.

FIG. 6C is a schematic side view of another packaged transistor amplifier 600C. Transistor amplifier 600C differs from transistor amplifier 600A in that it includes a different package 610C. The package 610C includes a metal submount 630 (which may be similar or identical to the like numbered submount 630 of package 210A), as well as metal gate and drain leads 622C, 624C. Transistor amplifier 600C also includes a plastic overmold 660 that at least partially surrounds the semiconductor device 300, the leads 622C, 624C, and the metal submount 630. Other components of transistor amplifier 600C may be the same as the like-numbered components of transistor amplifier 600A and hence further description thereof will be omitted.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, unless otherwise specified, "approximately" and/or "substantially" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device comprising:
   a substrate;
   a semiconductor structure comprising a channel layer and a barrier layer on the substrate;
   a source contact on a source region of the semiconductor structure;
   a drain contact on a drain region of the semiconductor structure;
   a gate contact on the barrier layer between the source contact and the drain contact;
   a metallization layer comprising a non-planar surface on a surface of the semiconductor structure;
   a non-planar encapsulation layer on the non-planar surface of the metallization layer, the non-planar encapsulation layer comprising a non-planar encapsulant surface that is opposite the non-planar surface, wherein the non-planar encapsulation layer is on the gate contact, the drain contact, and the source contact; and
a self-planarizing encapsulation layer on the non-planar encapsulation layer and comprising a planarized surface that is opposite the non-planar encapsulant surface.

2. The transistor device of claim 1, wherein a ratio of a thickness of the non-planar encapsulation layer over the gate contact to a thickness of the self-planarizing encapsulation layer over the gate contact is between 0.20 and 0.29.

3. The transistor device of claim 1, wherein the metallization layer comprises a transmission line on the source contact, and
wherein a ratio of a thickness of the non-planar encapsulation layer over the transmission line to a thickness of the self-planarizing encapsulation layer over the transmission line is between 0.28 and 0.45.

4. The transistor device of claim 1, wherein the semiconductor structure further comprises a source access region between the source contact and the gate contact, and
wherein a ratio of a thickness of the non-planar encapsulation layer over the source access region to a thickness of the self-planarizing encapsulation layer over the source access region is between 0.16 and 0.22.

5. The transistor device of claim 1, wherein a thickness of the non-planar encapsulation layer is substantially uniform over the semiconductor structure.

6. The transistor device of claim 1, wherein the non-planar encapsulation layer comprises SiO, SiN, SiON, ZrO, HfO, AN and/or AlO.

7. The transistor device of claim 1, wherein the self-planarizing encapsulation layer comprises polyimide, benzocyclobutene, glass, polyamide, polybenzoxazole, and/or a photoresist.

8. The transistor device of claim 1, wherein the self-planarizing encapsulation layer comprises a material having an uncured kinematic viscosity of 100 to 8000 centistokes.

9. The transistor device of claim 1, wherein the self-planarizing encapsulation layer comprises a material having a cure temperature of less than or equal to 250° C.

10. The transistor device of claim 1, wherein the self-planarizing encapsulation layer comprises a material that is substantially cured.

11. A transistor device comprising:
a substrate;
a semiconductor structure on the substrate, the semiconductor structure comprising a channel layer and a barrier layer;
a source contact on a source region of the semiconductor structure;
a drain contact on a drain region of the semiconductor structure;
a gate contact on the barrier layer between the source contact and the drain contact;
a first encapsulation layer extending on the gate contact, wherein the first encapsulation layer is non-planar, and wherein the first encapsulation layer is on the gate contact, the drain contact, and the source contact; and
a second encapsulation layer on the first encapsulation layer, wherein the second encapsulation layer is self-planarizing, the second encapsulation layer comprising a material having a cure temperature of less than or equal to 275° C.

12. The transistor device of claim 11, wherein a ratio of a thickness of the first encapsulation layer over the gate contact to a thickness of the second encapsulation layer over the gate contact is between 0.20 and 0.29.

13. The transistor device of claim 11,
wherein the transistor device further comprises a transmission line on the source contact, and
wherein the first encapsulation layer extends on the source contact and the transmission line.

14. The transistor device of claim 13, wherein a ratio of a thickness of the first encapsulation layer over the transmission line to a thickness of the second encapsulation layer over the transmission line is between 0.28 and 0.45.

15. The transistor device of claim 13, wherein the semiconductor structure further comprises a source access region between the source contact and the gate contact, and
wherein a ratio of a thickness of the first encapsulation layer over the source access region to a thickness of the second encapsulation layer over the source access region is between 0.16 and 0.22.

16. The transistor device of claim 11, wherein a thickness of the first encapsulation layer is substantially uniform over the semiconductor structure.

17. The transistor device of claim 11, wherein an upper surface of the second encapsulation layer is substantially planar over the semiconductor structure.

18. The transistor device of claim 11, wherein the first encapsulation layer comprises SiO, SiN, SiON, ZrO, HfO, AN and/or AlO.

19. The transistor device of claim 11, wherein the second encapsulation layer comprises polyimide, benzocyclobutene, glass, polyamide, polybenzoxazole, and/or a photoresist.

20. The transistor device of claim 11, wherein the second encapsulation layer comprises a material having a cure temperature of less than or equal to 250° C.

21. A transistor device comprising:
a semiconductor structure comprising a channel layer and a barrier layer on a substrate, the semiconductor structure comprising a source region and a drain region;
a source contact on the source region;
a drain contact on the drain region;
a gate contact on the barrier layer between the source contact and the drain contact;
a first encapsulation layer extending on the drain contact, on the source contact, on the gate contact, and on the semiconductor structure between the drain contact and the source contact, wherein the first encapsulation layer is non-planar; and
a second encapsulation layer on the first encapsulation layer, wherein the second encapsulation layer is self-planarizing, the second encapsulation layer comprising a material having a substantially planar upper surface that extends from the source contact to the drain contact, wherein the material is configured to transition from a kinematic viscosity of 100 to 8000 centistokes to a cured state during a curing operation.

22. The transistor device of claim 21, wherein the first encapsulation layer comprises SiO, SiN, SiON, ZrO, HfO, AN and/or AlO.

23. The transistor device of claim 21, wherein the first encapsulation layer comprises a plurality of layers.

24. The transistor device of claim 21, wherein the second encapsulation layer comprises polyimide, benzocyclobutene, glass, polyamide, polybenzoxazole, and/or a photoresist.

25. The transistor device of claim 21, wherein the second encapsulation layer comprises a material having a cure temperature of less than or equal to 275° C.

* * * * *

UNITED STATES PATENT AND TRADEMARK OFFICE
CERTIFICATE OF CORRECTION

| | |
|---|---|
| PATENT NO. | : 11,842,937 B2 |
| APPLICATION NO. | : 17/390020 |
| DATED | : December 12, 2023 |
| INVENTOR(S) | : Hardiman et al. |

It is certified that error appears in the above-identified patent and that said Letters Patent is hereby corrected as shown below:

On the Title Page

Item (71) Applicant: Please correct "Cree, Inc., Durham, NC (US)" to read --Wolfspeed, Inc., Durham, NC (US)--

Signed and Sealed this
Ninth Day of April, 2024

Katherine Kelly Vidal
*Director of the United States Patent and Trademark Office*